(12) United States Patent
Farquharson

(10) Patent No.: US 10,204,187 B1
(45) Date of Patent: Feb. 12, 2019

(54) METHOD AND SYSTEM FOR IMPLEMENTING DATA REDUCTION FOR WAVEFORM DATA

(71) Applicant: Cadence Design Systems, Inc., San Jose, CA (US)

(72) Inventor: Iain Farquharson, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 160 days.

(21) Appl. No.: 14/981,488

(22) Filed: Dec. 28, 2015

(51) Int. Cl.
*G06F 17/50* (2006.01)

(52) U.S. Cl.
CPC ...... *G06F 17/5009* (2013.01); *G06F 17/5045* (2013.01)

(58) Field of Classification Search
CPC ........................ G06F 147/5009; G06F 17/5045
USPC ........................................................ 716/139
See application file for complete search history.

(56) References Cited

U.S. PATENT DOCUMENTS

| | | | |
|---|---|---|---|
| 4,115,863 A | 9/1978 | Brown | |
| 4,481,605 A | 11/1984 | Pierce | |
| 5,043,920 A | 8/1991 | Malm | |
| 5,151,984 A | 9/1992 | Newman | |
| 5,528,356 A | 6/1996 | Harcourt | |
| 5,731,984 A | 3/1998 | Ullmann | |
| 5,764,872 A | 6/1998 | Koyamada et al. | |
| 5,838,949 A | 11/1998 | Hassoun | |
| 6,229,536 B1 * | 5/2001 | Alexander | G01R 13/345 345/440 |
| 6,664,913 B1 * | 12/2003 | Craven | H03M 7/3046 341/138 |
| 6,909,415 B2 | 6/2005 | Kumagawa | |
| 6,938,060 B2 | 8/2005 | Good et al. | |
| 7,102,068 B2 | 9/2006 | Kitayama | |
| 7,126,968 B2 | 10/2006 | Shinohara | |
| 7,551,777 B1 | 6/2009 | Pichumani | |
| 8,325,188 B1 | 12/2012 | Phillips | |
| 2002/0093841 A1 * | 7/2002 | Kitayama | G10H 1/057 365/1 |
| 2002/0178006 A1 * | 11/2002 | Suzuki | G10H 1/02 704/258 |
| 2004/0243372 A1 | 12/2004 | Tester | |
| 2007/0217694 A1 * | 9/2007 | Sullivan | G01R 13/0272 382/232 |
| 2007/0236480 A1 * | 10/2007 | Sullivan | G09G 5/39 345/204 |
| 2009/0225083 A1 * | 9/2009 | Thomas | G01R 13/02 345/440 |

(Continued)

OTHER PUBLICATIONS

Non-Final Office Action dated Nov. 17, 2017 for U.S. Appln. No. 15/198,864.

(Continued)

*Primary Examiner* — Suchin Parihar
(74) *Attorney, Agent, or Firm* — Vista IP Law Group, LLP

(57) ABSTRACT

An improved approach is provided to generate and display waveform data, where data reduction is intelligently applied to create filtered waveform data. By reducing the quantity of the waveform data in an intelligent manner, this permits the waveform display tool to process the waveforms quickly enough for interactive usage, while still retaining sufficient data fidelity for accurate data analysis and waveform visualization.

20 Claims, 38 Drawing Sheets

(56) References Cited

U.S. PATENT DOCUMENTS

2012/0036171 A1* 2/2012 Rindner ............. G06F 17/5036
 708/207
2012/0046931 A1* 2/2012 Takahashi ........... G06F 17/5036
 703/15

OTHER PUBLICATIONS

Notice of Allowance dated May 18, 2018 for U.S. Appln. No. 15/198,864.

* cited by examiner

US 10,204,187 B1

METHOD AND SYSTEM FOR IMPLEMENTING DATA REDUCTION FOR WAVEFORM DATA

FIELD

This disclosure relates to the field of electrical design and verification.

BACKGROUND

Modern electronic design is typically performed with computer aided design (CAD) tools or electronic design automation (EDA) systems. To design a circuit, such as an integrated circuit (IC), a designer first creates high level behavior descriptions of the IC device using a high-level hardware design language (HDL). Common examples of HDLs include Verilog and VHDL. An EDA system typically receives the high level behavioral descriptions of the IC device and translates this high-level design language into netlists of various levels of abstraction. Essentially, the process to implement an electronic device begins with functional design and verification (e.g., using RTL), and then proceeds to physical design of a layout and verification.

Circuit designers and verification engineers use different methods to verify circuit designs. One common method of verification is the use of simulation. Simulation dynamically verifies a design by monitoring behaviors of the design with respect to test stimuli. For many types of designs, simulation can and should be performed during the design process to ensure that the ultimate goals are achievable and will be realized by the finished product.

For example, SPICE and FASTSPICE are common types of simulators that perform simulation to verify the operation of an electronic design. With these types of tools, the electronic design is converted into a system of equation(s), which is then solved for a given set of inputs to check the state of specific portions of the circuit at given points in time.

A significant portion of the data pertaining to the simulation activities may be waveform data. In many cases, the waveform is the output data that results from performing simulation on analog or analog/mixed signal designs. For example, a given circuit design may receive a set of stimulus data, where simulation of a model of that circuit design is performed using the stimulus to identify the resulting waveform pattern from expected operation of that design. In other cases, the waveform data is the input data that is fed into a circuit design for simulation.

The EDA tool may employ either a waveform viewing tool or a waveform editing tool to visually display waveform data onto the user interface of a user display apparatus. In many cases, these tools are operated in an interactive manner, where a user dynamically manipulates the tool to display the waveform data in real-time with a desired visual representation. For example, the user may manipulate the waveform tool to zoom into a specific portion of the waveform or to scroll across different portions of the waveform. This interactive manipulation permits the user to analyze the waveforms and to seek out anomalies that may indicate possible errors in the circuit design, by scanning through the data and zooming in at specific portions of the waveforms.

Under the covers, numerous computational operations may be performed to comply with the user's manipulation of the waveform tool. Such operations may involve loading the waveform data into memory, retrieving the specific data to be operated upon, performing graphical operations upon that data to generate display data as required by the user commands, and generation of the interface for display. With interactive tools, it is desirable for these operations to be performed fast enough such that the user does not experience undue delays while rendering the waveform for display on the display screen.

The problem is that modern EDA tools are now generating massive quantities of waveform data, e.g., involving tens of millions of datapoints on thousands of waveforms. In many cases, many or all of the waveforms need to be displayed simultaneously onto a computer display screen. Given this large volume of waveform data, it is becoming very difficult to maintain interactive performance from conventional waveform viewing tools. These performance problems occur because even simple calculations become very difficult to process when there is both a large amount of data and a need to quickly process that data for display on an interactive tool.

Therefore, there is a need for an improved approach to handle waveform data that that can adequately address these problems with the conventional tools.

SUMMARY

Embodiments of the invention provide an improved method, system, and computer program product to perform data reduction of waveform data. By reducing the quantity of the waveform data in an intelligent manner, this permits the waveform display tool to process the waveforms quickly enough for interactive usage, while still retaining sufficient data fidelity for accurate data analysis and waveform visualization.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE DRAWINGS

In order that the present invention is better understood, some embodiments of the invention will now be described, by way of example only, with reference to the accompanying drawings.

DETAILED DESCRIPTION

Embodiments of the invention provide an improved method, system, and computer program product to perform data reduction of waveform data. By reducing the quantity of the waveform data in an intelligent manner, this permits the waveform display tool to process the waveforms quickly enough for interactive usage, while still retaining sufficient data fidelity for accurate data analysis and waveform visualization.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Figure 1:
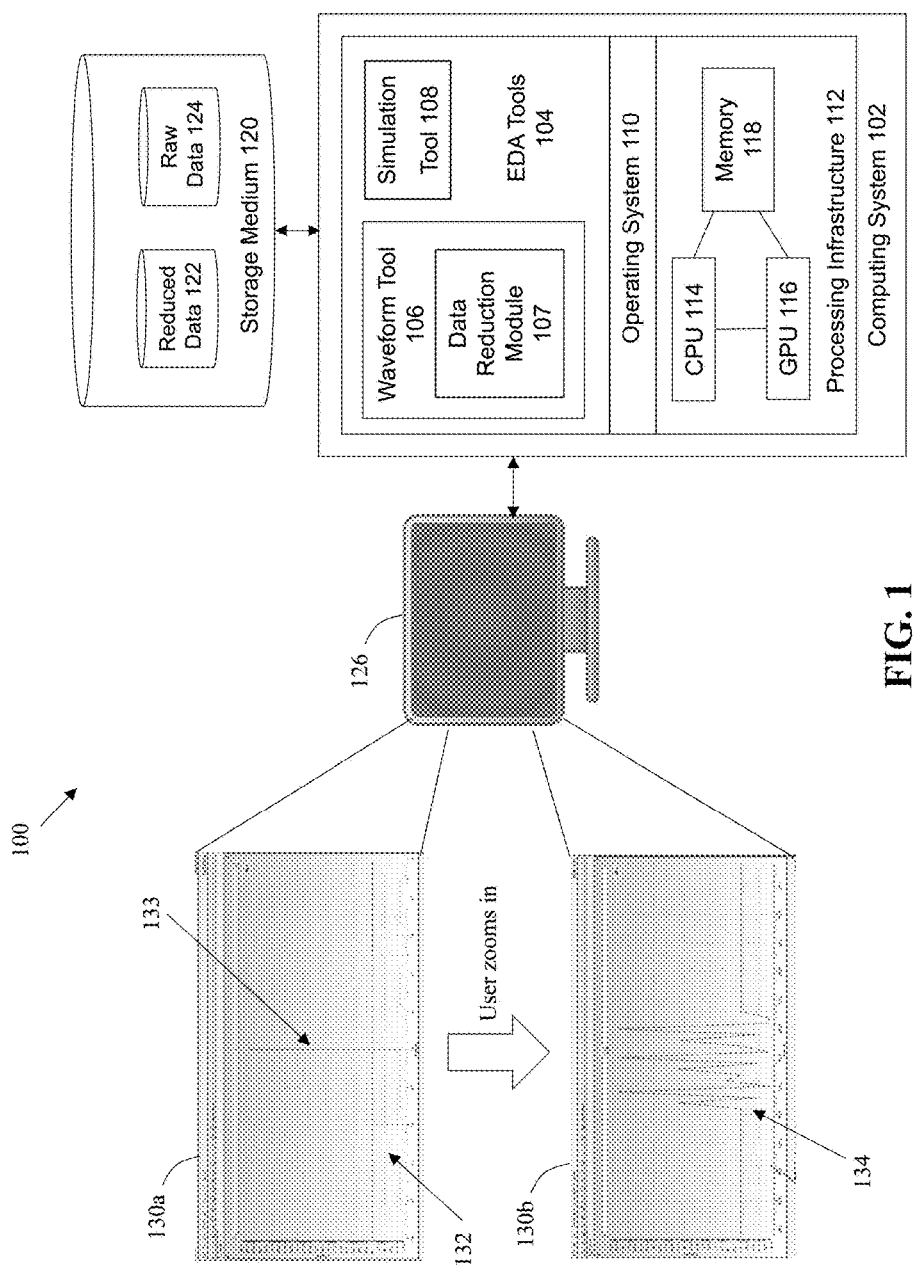
FIG. 1 illustrates an example system which may be employed in some embodiments of the invention to implement waveform visualization of an electronic design.

FIG. 1 illustrates an example system 100 which may be employed in some embodiments of the invention to implement waveform visualization of an electronic design. System 100 may include one or more users that interface with and operate computing system 102. Such users include, for example, design engineers or verification engineers. Computing system 102 comprises any type of computing station that may be used to operate, interface with, or implement one or more EDA applications 104. Examples of such computing systems 102 include for example, servers, workstations, personal computers, or remote computing terminals connected to a networked or cloud-based computing platform. The computing system 102 may comprise one or more input devices for the user to provide operational control over the activities of the system 100, such as a mouse or keyboard to manipulate a pointing object. The computing system 102 may also be associated with a display device 126, such as a display monitor, for displaying electronic design analysis results to users of the computing systems 102.

The electronic design data, including the raw waveform data 124, may be stored in a computer readable storage medium 120. The computer readable storage medium 120 includes any combination of hardware and/or software that allows for ready access to the data that is located at the computer readable storage medium 120. For example, computer readable storage medium 120 could be implemented as computer memory and/or hard drive storage operatively managed by an operating system, and/or remote storage in a networked storage device, such as networked attached storage (NAS), storage area network (SAN), or cloud storage. The computer readable storage medium 120 could also be implemented as an electronic database system having storage on persistent and/or non-persistent storage.

A graphical user interface may be presented to the user on the display device 126. For example, a waveform display tool 106 may generate a user interface to display waveform data to a user. The waveform data may be created by, for example, a simulation tool 108. The user may manipulate and/or operate the waveform display tool 106 to change the way that waveform data is displayed to the user.

Interface 130a illustrates a waveform 132 that is presented to a user on display device 126. It is noted that the waveform 132 is a relatively uniform set of X,Y data with the exception of a portion 133 that is distinctly different from the rest of the waveform 132 with a pronounced spike in the dataset. In this situation, the user would likely be interested in viewing additional details of the somewhat anomalous and glitchy portion 133. However, at the current level of viewing resolution shown in interface 130a, it is very difficult to see any pertinent details for portion 133. Therefore, the user may wish to magnify portion 133, by zooming into that specific portion of the waveform 132. In response, a revised interface 130b is presented to the user that shows zoomed portion 134 which now shows additional visual details of the waveform.

The waveform display tool 106 interacts with an operating system 110 to operate a processing infrastructure 110 to generate the display data to be displayed on the display device 126. The processing infrastructure 112 includes one or more processors 114 (e.g., a central processing unit or CPU) that operate in conjunction with memory 118 and a graphics processing unit 116 (GPU) to generate the display data for the waveforms. The CPU operates to process commands to implement and operate the EDA tool 104, which may involve reading and processing of raw waveform data 124 pertaining to the waveforms. During processing, data pertaining to the waveforms may be loaded onto memory 118. The GPU is a specialized component that is designed to perform image and graphics processing to image data for display on a display device. The memory 118 and GPU 116 may be separate from, and/or located onboard the CPU 114.

Even with the use of a dedicated GPU, it is problematic for conventional waveform display tools to be able to adequately manipulate the vast amount of the raw data 124 for waveforms, especially in the context of an interactive tool. Graphics engines used for waveform display have limited speed abilities for interactive performance (e.g., in terms of pixels drawn per second), and therefore large quantities of waveform data may render conventional system inadequate to render display data quickly enough for interactive purposes.

Embodiments of the present invention solve this problem by generating a reduced set 122 of waveform data that is derived from the raw waveform data 124. A data reduction module 107 determines the appropriate level of data reduction for the visualization desired by the user, and generates the reduced data set having the required level of resolution.

By creating a reduced set of data, this allows a much smaller amount of data to be processed by the processing infrastructure to generate graphical data for display on the display device 126. By inducing less load on the processing infrastructure 112, particularly the GPU 116, this allows the data throughput of the processing infrastructure to 112 to be fast enough to generate the display data for waveforms without experiencing appreciable amounts of lag or delay in presenting the waveform data to the user.

Figure 2:
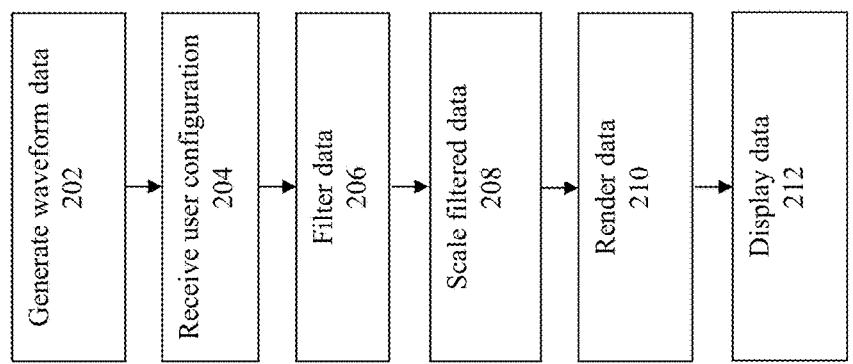
FIG. 2 shows a flowchart of an approach to implement data reduction in the waveform data according to some embodiments of the invention.

FIG. 2 shows a flowchart of an approach to implement data reduction in the waveform data according to some embodiments of the invention. At 202, the raw, original waveform data is generated. The data is generated, for example, by operating a simulation tool such as SPICE upon an electronic design to obtain simulation results. A waveform editor may also be used to generate the waveform data, e.g., as the input stimulus to a simulation tool.

At 204, user instructions are received at the waveform tool. The user instructions pertain to any operational instructions or UI manipulations that would affect the way that the waveform data is displayed on a display device. For example, the user may seek to zoom into a specific portion of the waveform data, may seek to change the visual appearance of the waveform (e.g., by using thicker lines to represent the waveform), or may choose to directly filter the data (e.g., by invoking a UI interface to change the waveform resolution).

Each of these actions may directly affect the volume of waveform data that needs to be processed by the system to generate display data. The reason is that a display device has a given resolution in terms of the number of pixels displayable on the device. The large volume of the raw waveform data corresponds to many more datapoints than the number of pixels that exist on the display device. The job of the graphics processing infrastructure (e.g., GPU) is to generate the image data for every pixel to be shown at the (X,Y) positions of the display. However, if the GPU processes all of the raw data, then the GPU is in effect performing wasted work by processing extraneous data that do not contribute to visually necessary pixels on the display screen.

Therefore, at 206, the raw data is filtered to a set of reduced waveform data. By intelligently filtering the waveform data, the remaining filtered data can be reduced to a level that is more appropriate to the visualization desired by the user, while also providing a much smaller volume of data that can be more efficiently handled by the graphics processing infrastructure. As described in more detail below, this is accomplished by retaining certain salient data points that are necessary for desired data representation purposes and discarding the rest of the data.

At 208, the filtered data can then be scaled as appropriate for the visualization desired by the user. In other words, the visual representation of the filtered waveform data may change to accommodate the chosen view of the data by the user. For example, zooming in on a set of waveform data may change the scale along the X and/or the Y directions for the displayed data. Given the much smaller volume of the filtered data as compared to the original raw data, the number of scaling operations also is much reduced (and therefore performed more efficiently) with the present invention.

At 210, the display data is then rendered by the processing system. This is performed, for example, by having the GPU perform image manipulation operations to generate the pixel data to display on the display screen, where the rendered data corresponds to the filtered and scaled waveform data. At 212, the rendered data is then displayed on the display device.

In general, filtering is performed by dividing the (X,Y) waveform datapoints into a specific set of "slices" along the X axis, where each slice corresponds to a set of data from the original dataset that is processed together as a unit for data reduction purposes. For each slice, the filtering process records a certain subset of the datapoints in that slice, while discarding the rest of the datapoints. In some embodiment, the retained subset of datapoints corresponds to the first datapoint in the slice, the last datapoint in the slice, the datapoint having the maximum Y-axis value, and the datapoint having the minimum Y-axis value. All other datapoints are discarded. In some cases, a slice may retain less than four datapoints if the same datapoint corresponds to multiple ones of these categories, e.g., where the first datapoint is also the maximum and/or minimum Y-axis datapoint.

When rendering the waveform for display, this means that regardless of the number of datapoints in the original waveform dataset, a maximum of only four datapoints needs to be rendered for any of the slices in the waveform. The number of slices will therefore control the amount of data reduction, where a smaller number of slices translates to a greater amount of data reduction.

Figure 3:
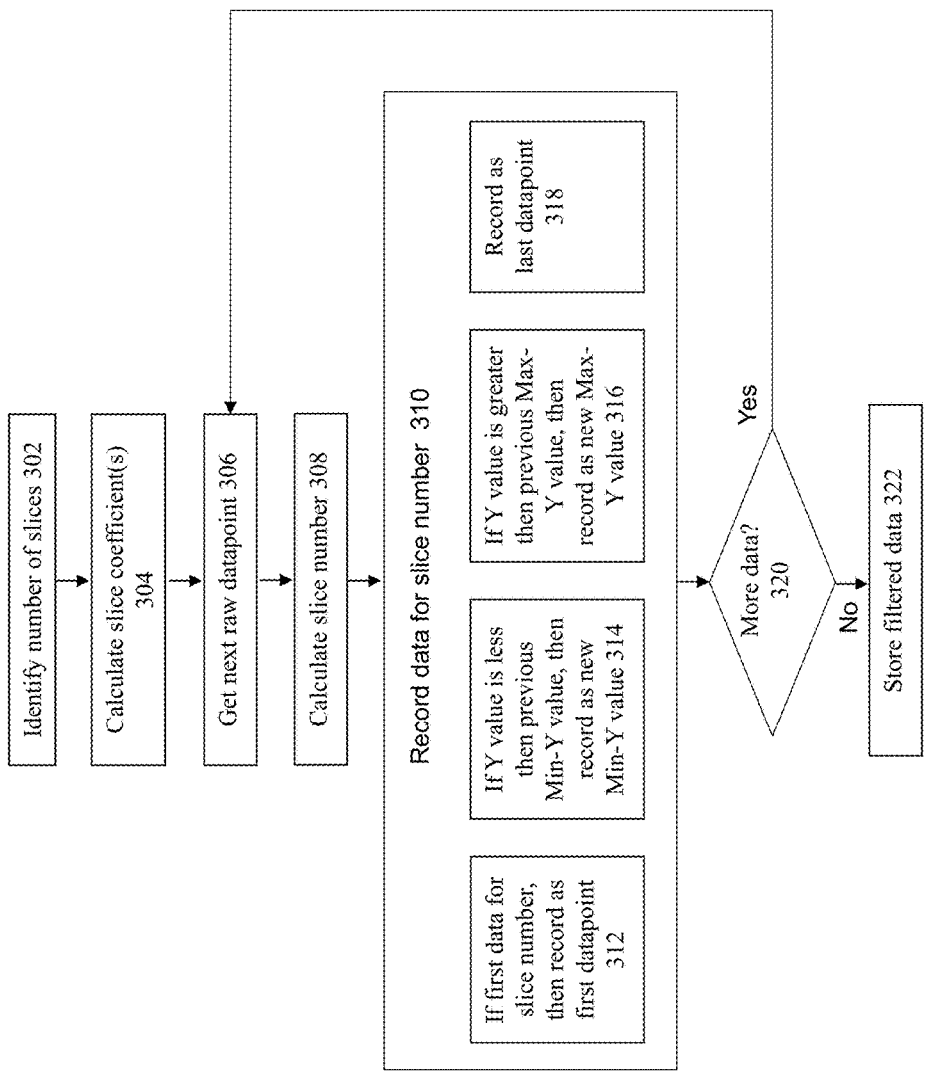
FIG. 3 shows a flowchart of an approach to implement filtering of the waveform data according to some embodiments of the invention.

FIG. 3 shows a flowchart of an approach to implement filtering of the waveform data according to some embodiments of the invention. At 302, identification is made of the number of slices for the data reduction. Any number of appropriate factors can be taken into consideration to determine the number of slices, such as thickness of displayed lines, magnification level of the waveform on the user interface, number of waveforms to simultaneously display, tuning for the displayable resolution of the screen display, and/or user preference for the data reduction. If the displayed line width is thicker/visually magnified, then a smaller number of slices may be used to increase data reduction, since any extra data resolution from having a larger number of slices would be extraneous. Similarly, the user-desired magnification levels may control the level of detail and/or viewable set of data that should be retained, with excess data filtered from the dataset by reducing the number of slices. With regards to the number of simultaneous waveforms to display, an increase in the number of waveforms to display could be used to reduce the number of slices for the data. In addition, the user preferences for data reduction can be used to control with number of slices, with user instructions for greater data reduction being translated into a correspondingly smaller number of slices. With regards to screen resolution, the number of slices can be tuned to correspond to the number of viewable pixels on the display screen, so that excess datapoints that will not meaningfully affect the viewable waveforms are filtered from the dataset.

At 304, one or more slice coefficients are calculated to perform integer rounding of each X value in the raw data into a slice number. The slice coefficient value can be used, for example, as a multiplier against the X value of a given datapoint, where integer rounding is then performed to derive the slice number of that datapoint. For example, if the full dataset of waveform data extends for 10 seconds along the X axis and the number of slices is configured to be 10, this means that the slice coefficient will cause all datapoints from 0 to just short of 1 second to translate to slice number 1, the next set of data points up to 2 seconds to translate to slice number 2, and so on. This means that all datapoints will corresponds to at least one of the 10 slices.

At this point, the process walks through the entire set of the raw data along the X-axis to perform the filtering. At 306, the next datapoint is selected for processing. If this is the start of the process, this means that the very first datapoint is selected for processing. Using the slice coefficient, a slice number is calculated for that datapoint.

Certain information is then recorded for each slice number at 310. For example, for each slice number, the process records the first datapoint for that slice (312), the datapoint with the minimum Y value (314), the datapoint with the maximum Y value (316), and the last datapoint for the slice (318). In some embodiments, if the slice number is directly adjacent to the next slice number, then the process discards the last datapoint, as this is unnecessary for drawing purposes.

At 320, the process checked whether there are any further datapoints to process. If so, then the process returns back to 306 to select the next datapoint for processing. This processing therefore walks through the data along the X-axis, where any subsequent datapoint for a given slice that is either greater than the previous max Y value, smaller than the previous min Y value, or is potentially a new last datapoint for the slice will overwrite the previous datapoint that was recorded for that slice for that category. If there is no further data for processing, then the filtered data is stored at 322.

At the end of the processing, each slice will have reduced its set of datapoints to no greater than four datapoints that correspond to the four categories described above. This is regardless of the original number of datapoints in a given slice. This type of processing is computationally very inexpensive to perform, and hence can be readily implemented in real-time even for very large datasets. In addition, this type of filtering is capable of achieving significant reductions in the quantity of the waveform data, depending upon the number of slices selected for the filtering.

Figure 4A:
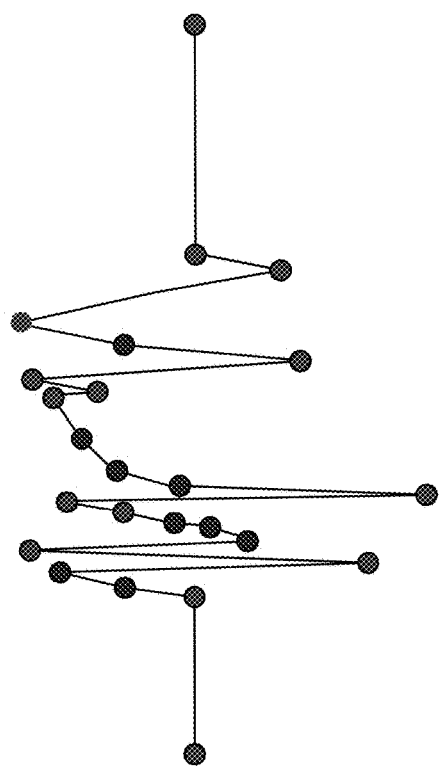
FIGS. 4A-4B illustrate correlation of slices to raw data.

To illustrate this process, consider the example set of data 400 shown in FIG. 4A. This set of data 400 includes numerous data points, where each of the datapoints is associated with a specific (X,Y) coordinate value. Assume that this set of data 400 corresponds to a waveform for which there is a desire to perform data reduction.

The first step is to identify the number of slices for the data reduction. As noted above, any number of factors can be taken into consideration to determine the number of slices, such as thickness of displayed lines, magnification level of the waveform on the user interface, number of waveforms to simultaneously display, tuning for the displayable resolution of the screen display, and/or user preference for the data reduction.

Figure 4B:
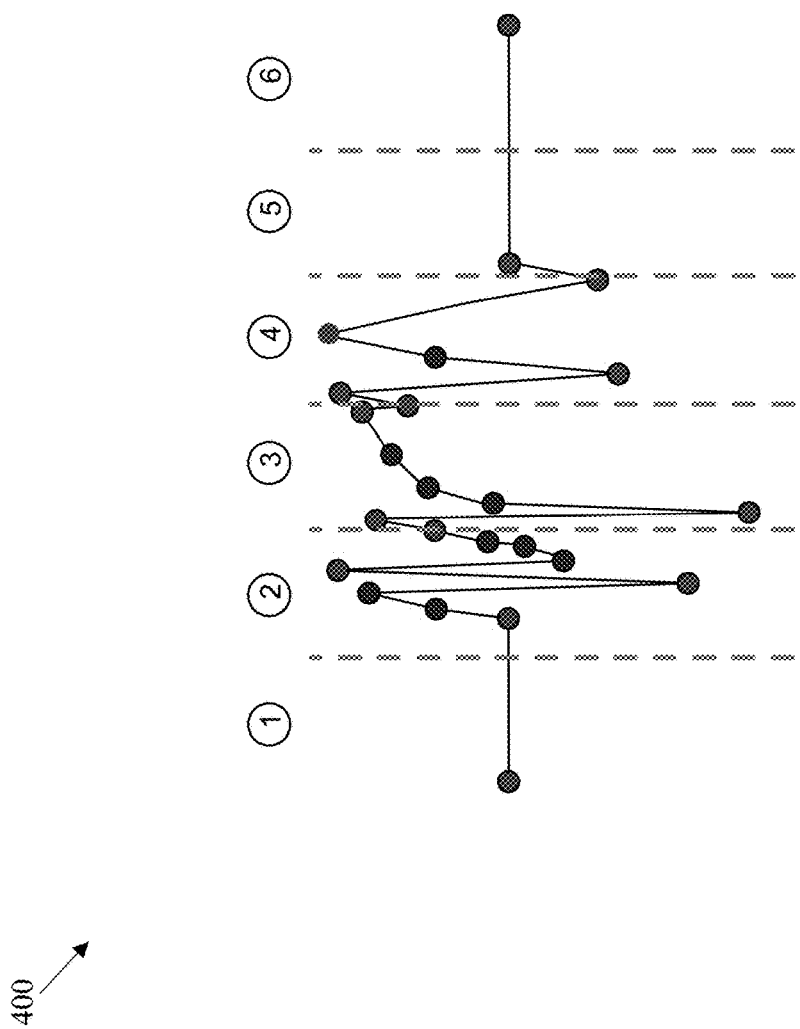

Assume for the sake of illustration that the dataset is to be divided into six slices. A slice coefficient is identified so that each of the datapoints will translate to correspond to one of the six slices. FIG. 4B illustrates example boundaries that may be established for the six slices for dataset 400.

The next step is to walk through the dataset 400 and to identify, for each slice, the datapoints that correspond to the four categories of (a) starting datapoint, (b) minimum Y datapoint, (c) maximum Y datapoint, and (d) ending datapoint.

Figure 5A:
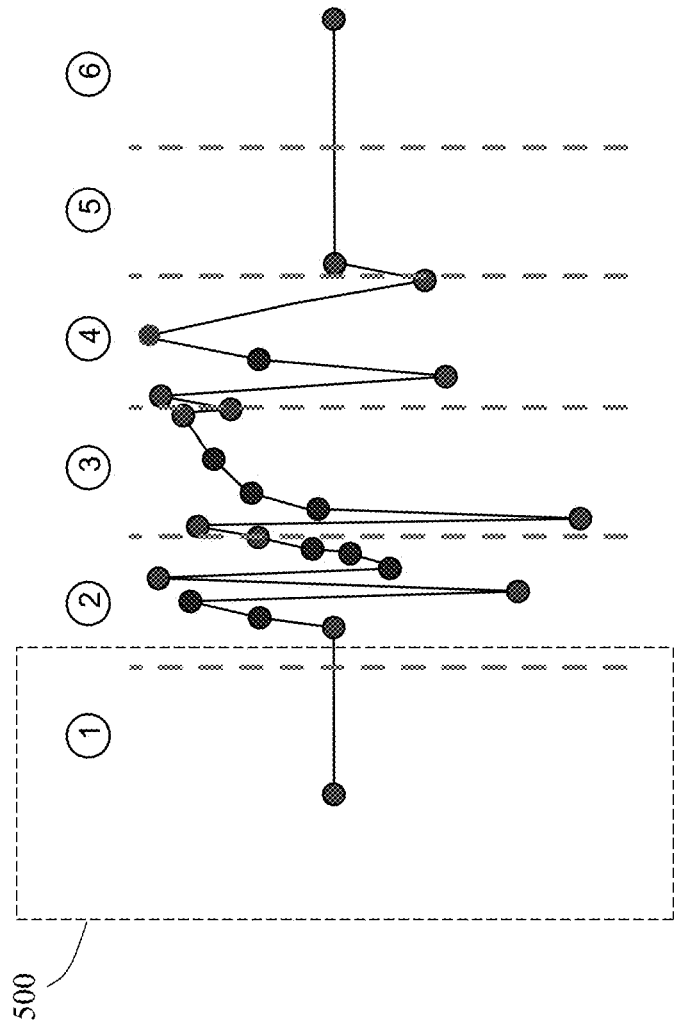
FIGS. 5A-5C, 6A-6T, 7, 8, 9, 10, and 11 illustrate data reduction applied to an example waveform dataset.
Figure 5B:
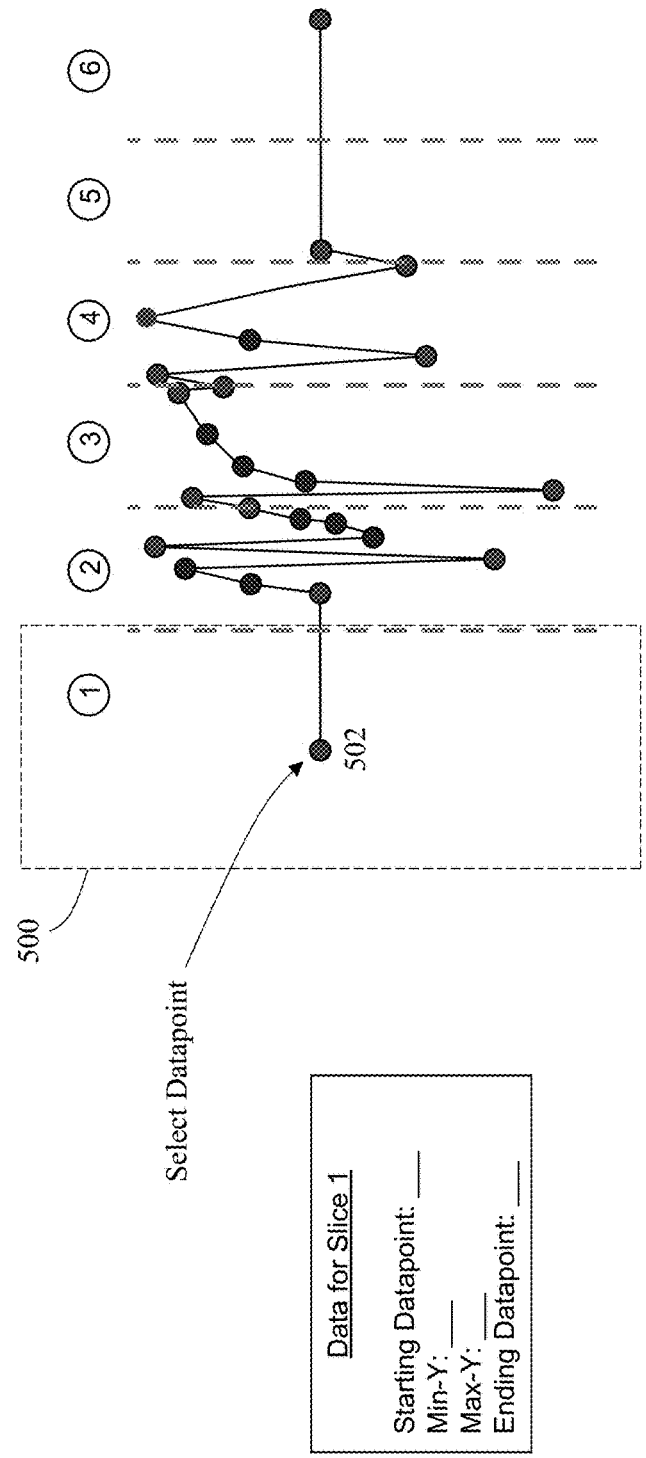
Figure 5C:
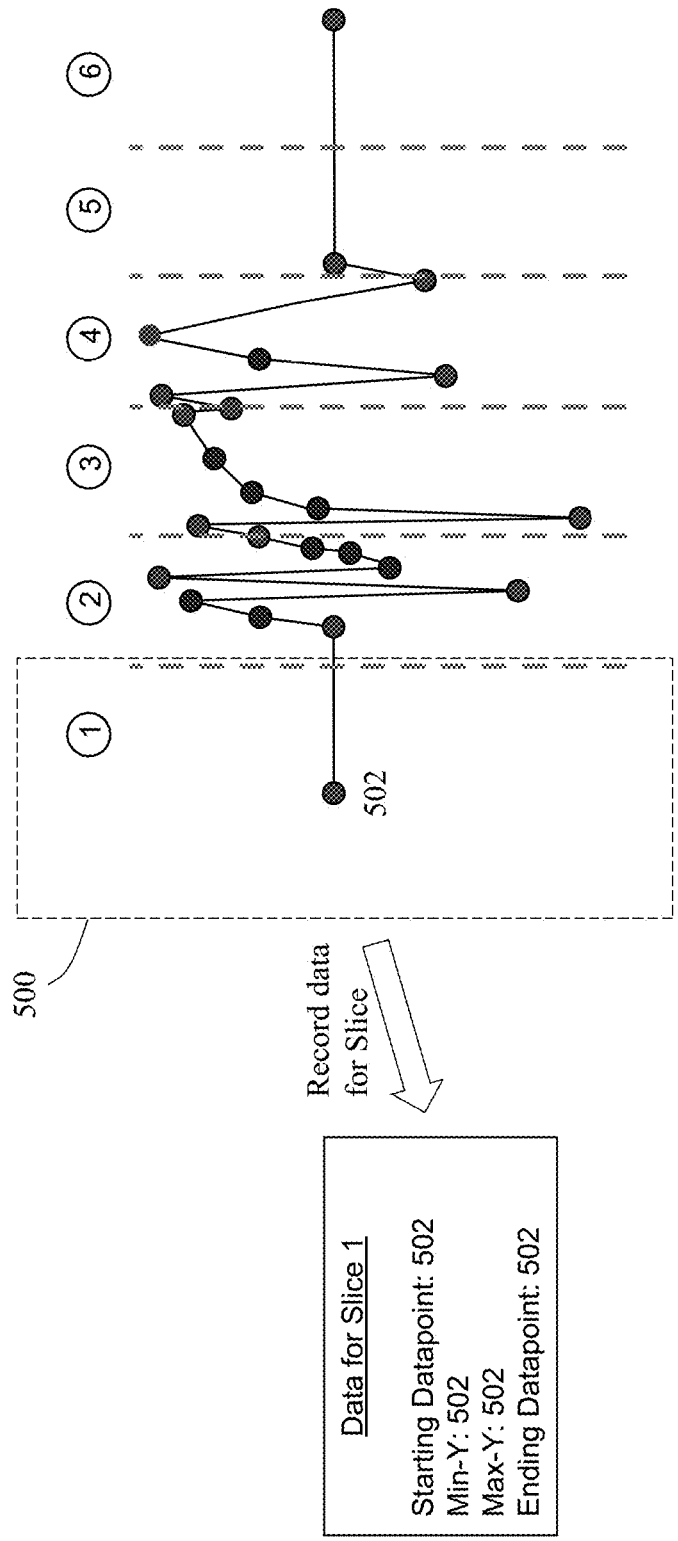

FIGS. 5A-C illustrate this process for the first slice. In FIG. 5A, box 500 is drawn to represent the space of any datapoints having an X value which translates to the first slice. As shown in FIG. 5B, the first datapoint 502 is selected for processing. In this situation, the X value of datapoint 502 translates to slice number 1. Therefore, as shown in FIG. 5C, this datapoint is recorded for each of the four categories for slice number 1 for (a) starting datapoint, (b) minimum Y datapoint, (c) maximum Y datapoint, and (d) ending datapoint. Since there are no other datapoints that correspond to slice number 1, no further processing will occur that will update any of these categories for slice number 1.

Figure 6A:
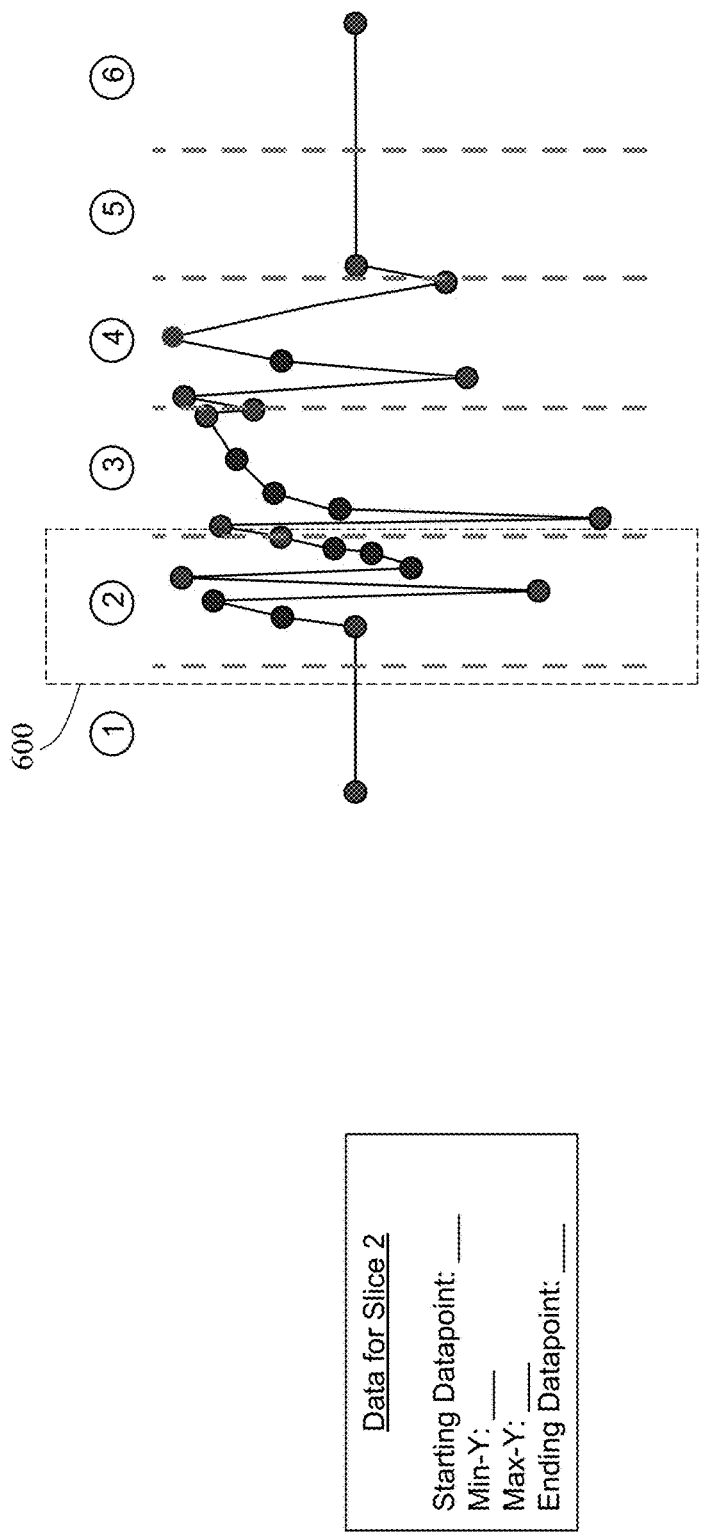
Figure 6B:
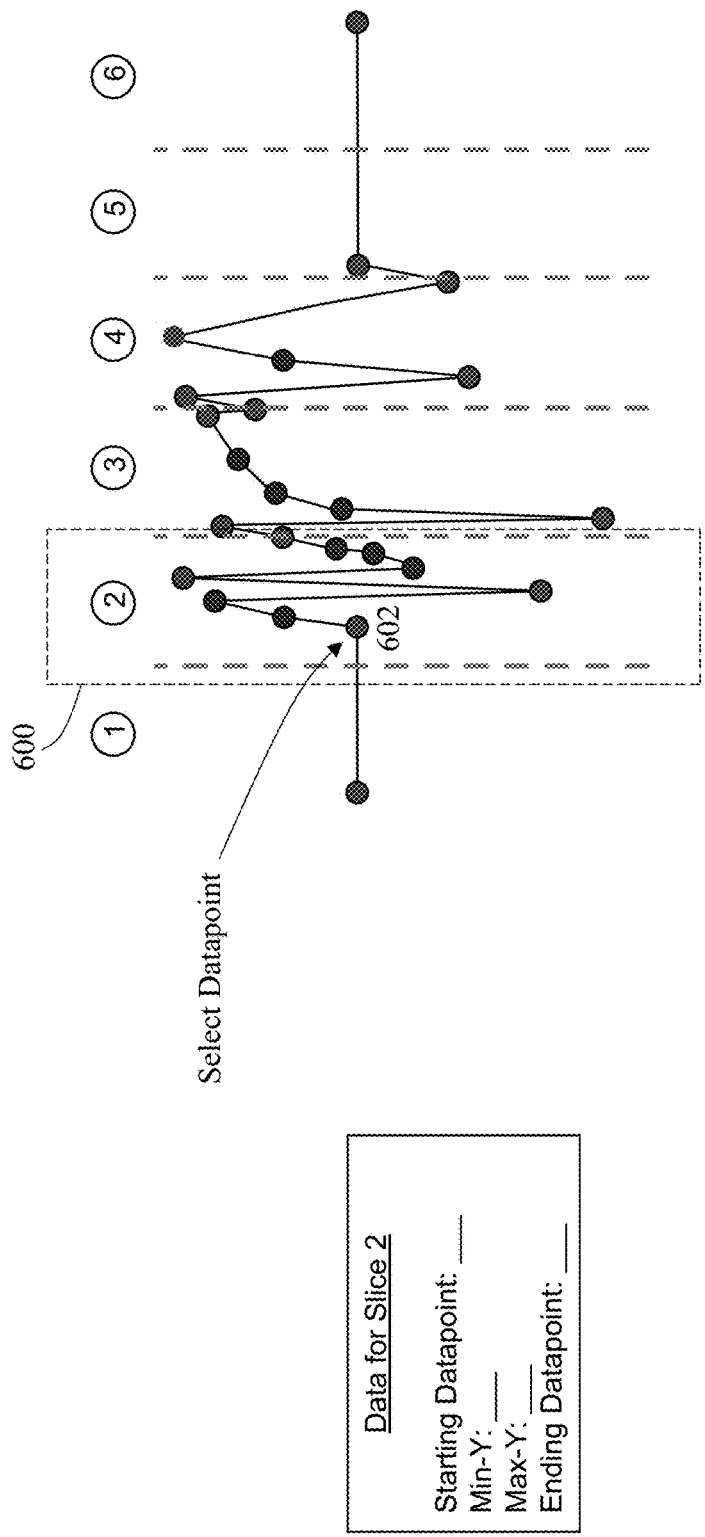
Figure 6C:
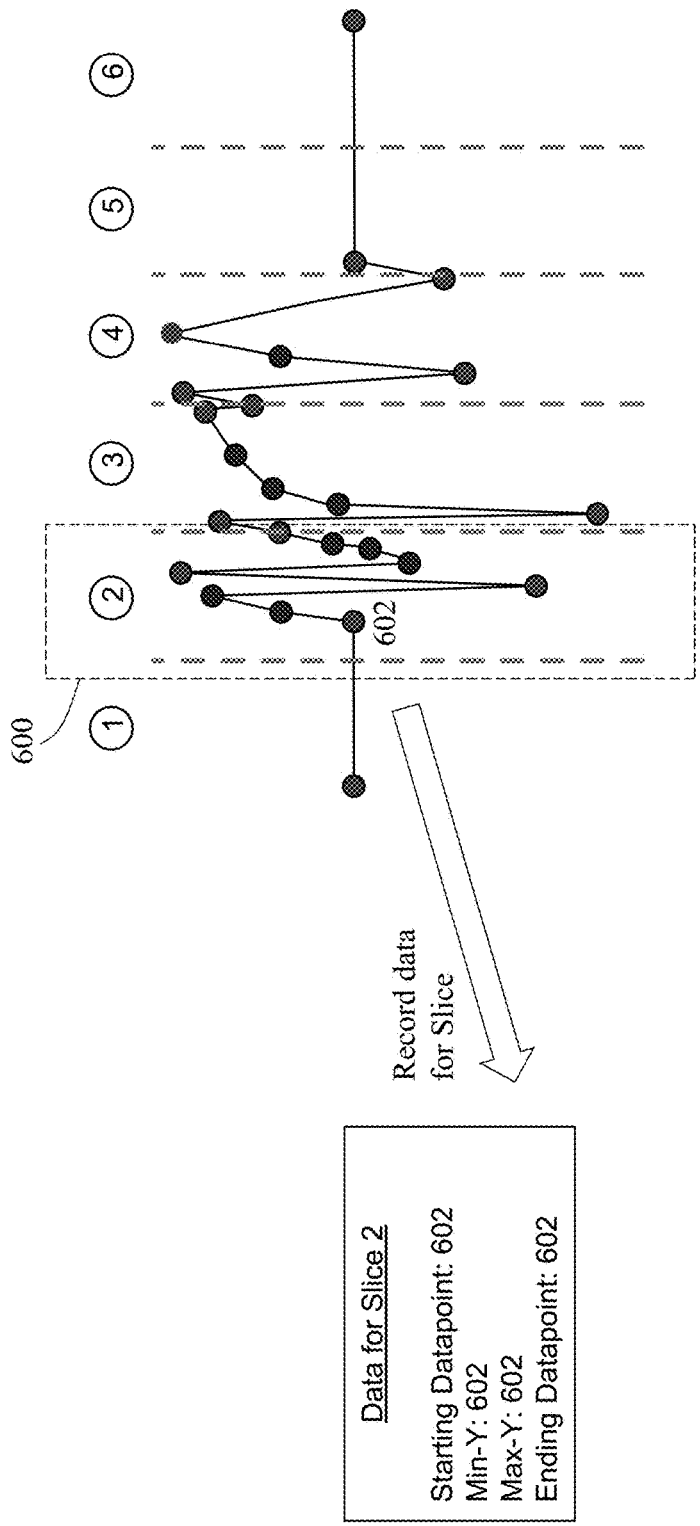
Figure 6D:
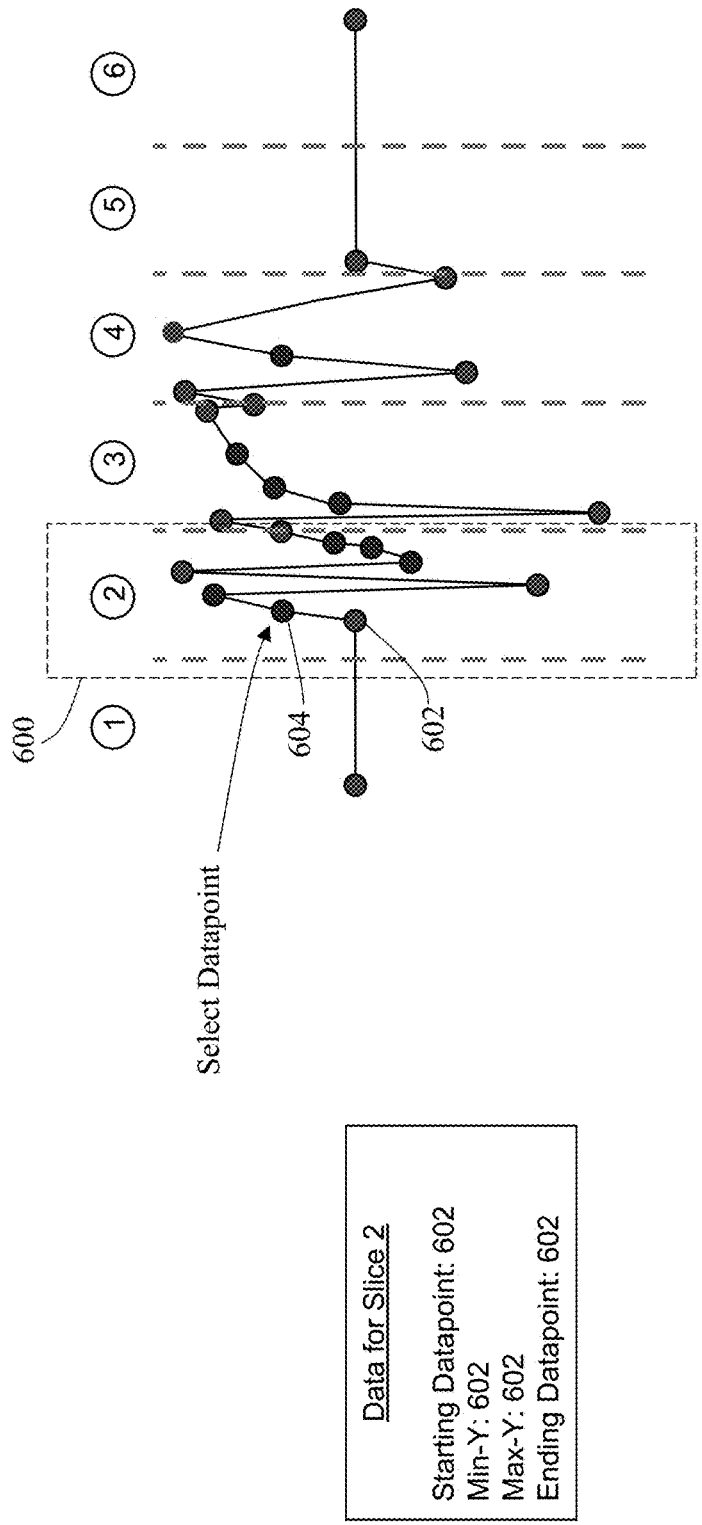
Figure 6E:
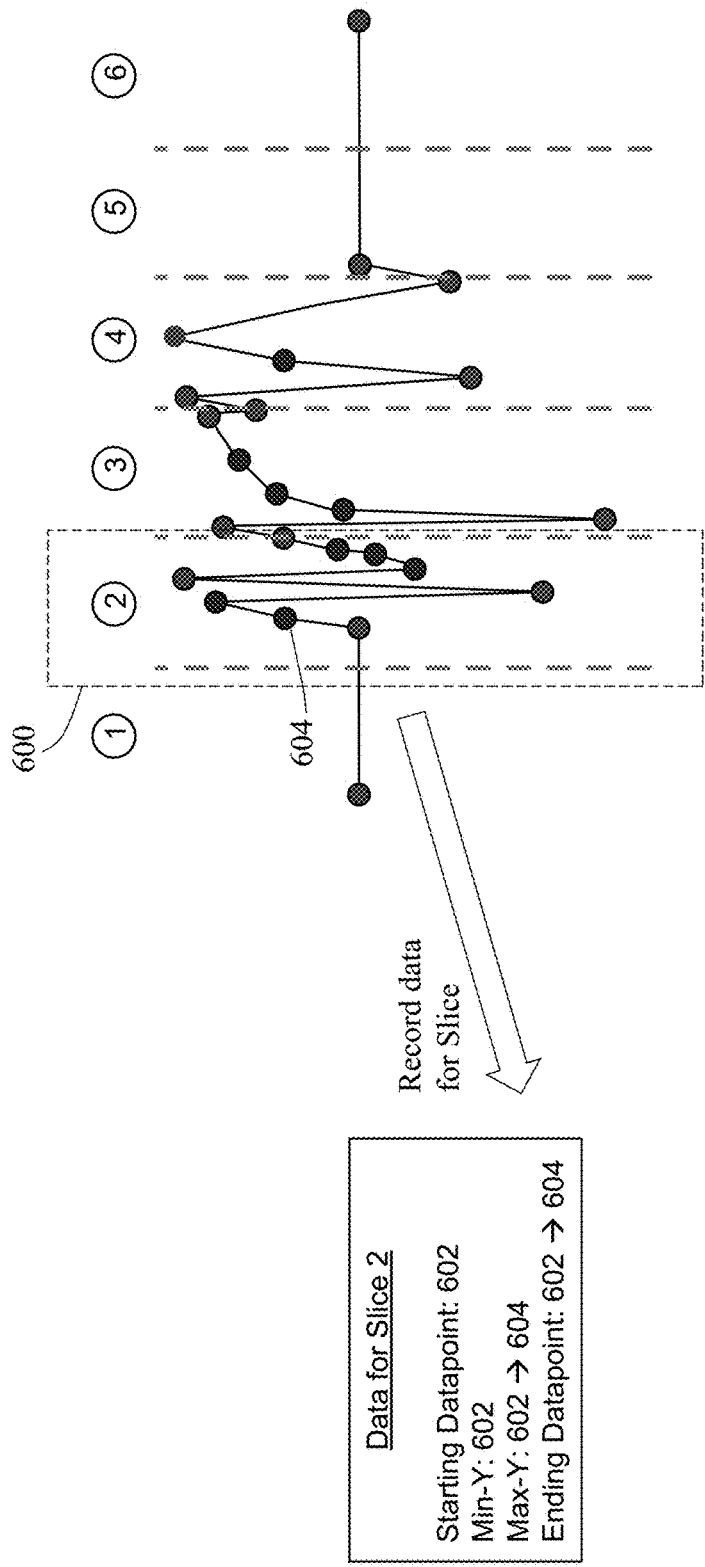
Figure 6F:
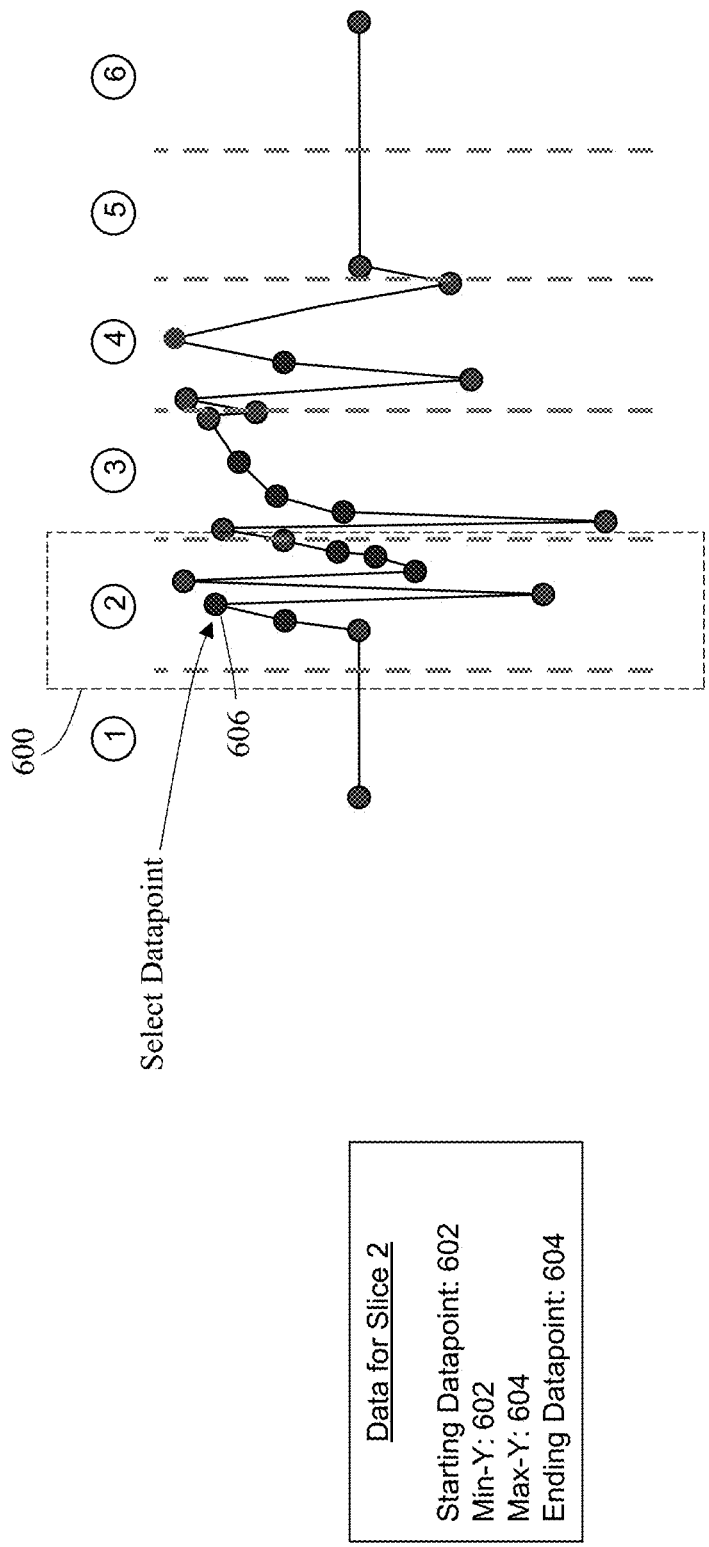
Figure 6G:
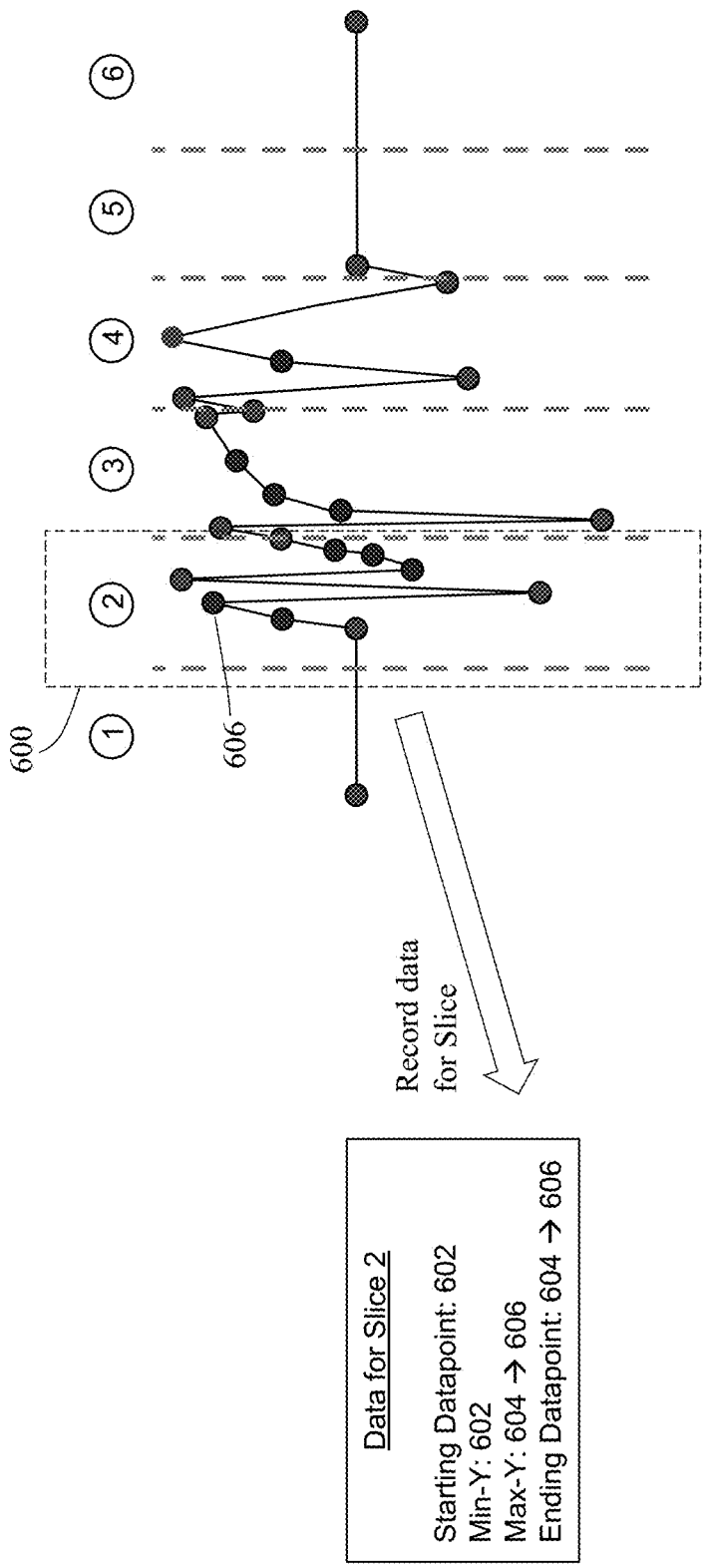
Figure 6H:
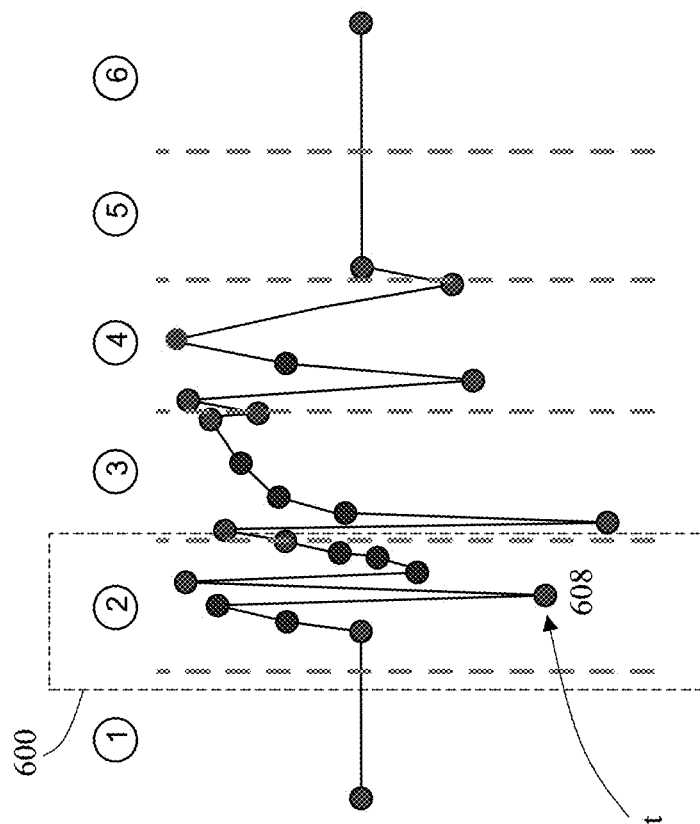
Figure 6I:
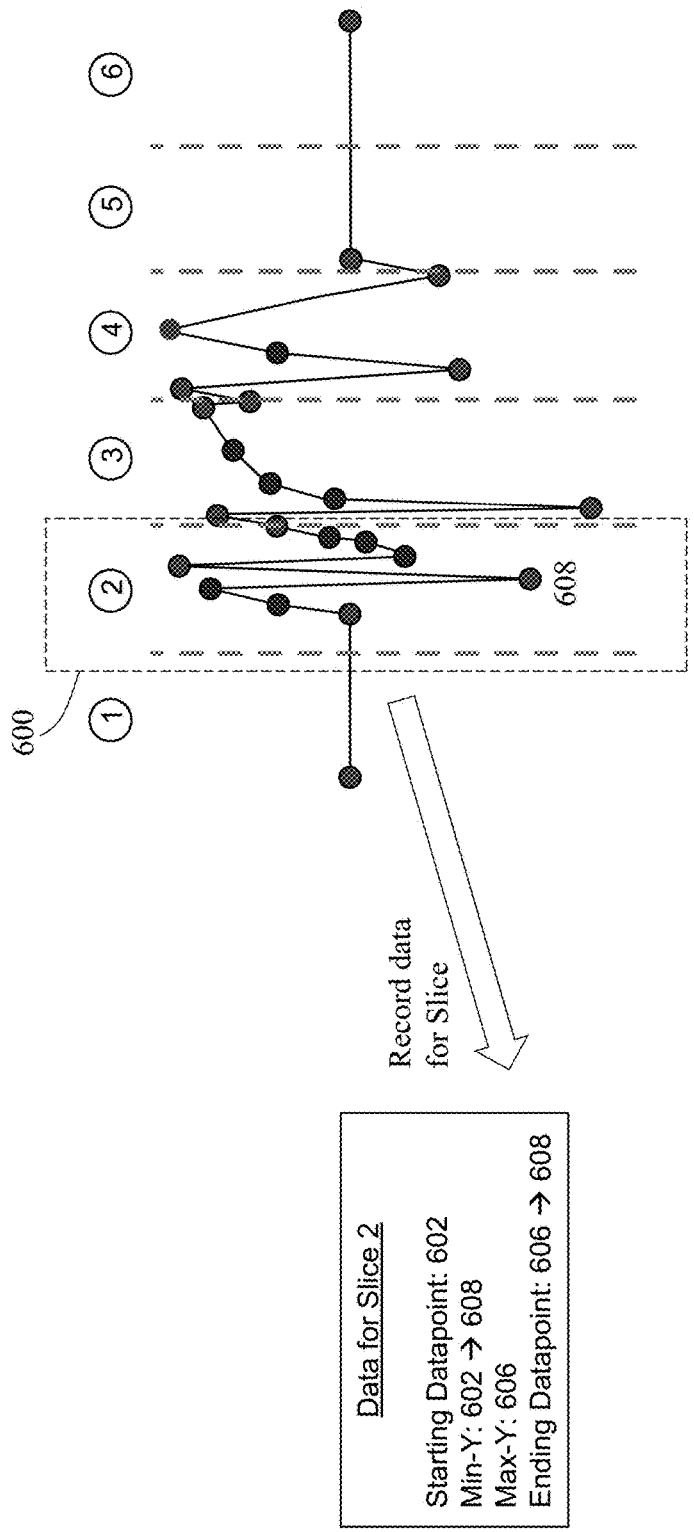
Figure 6J:
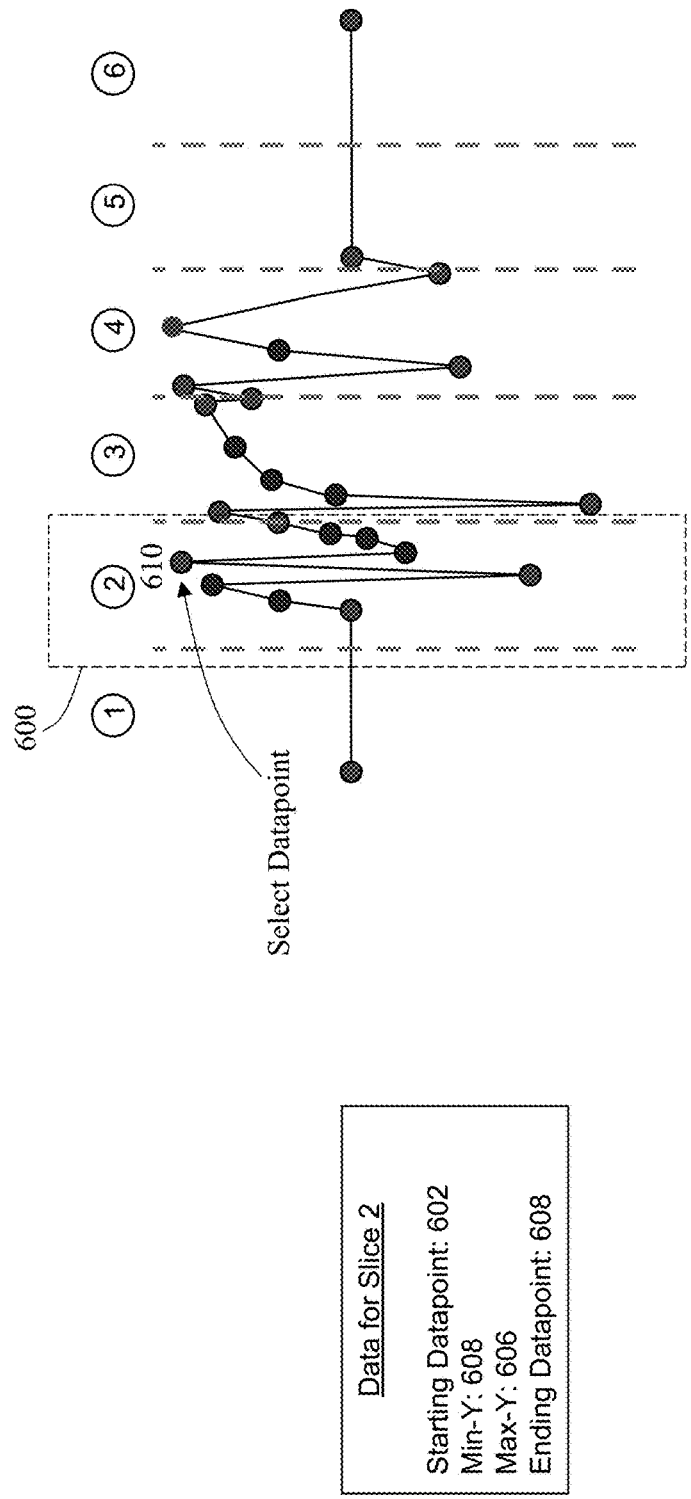
Figure 6K:
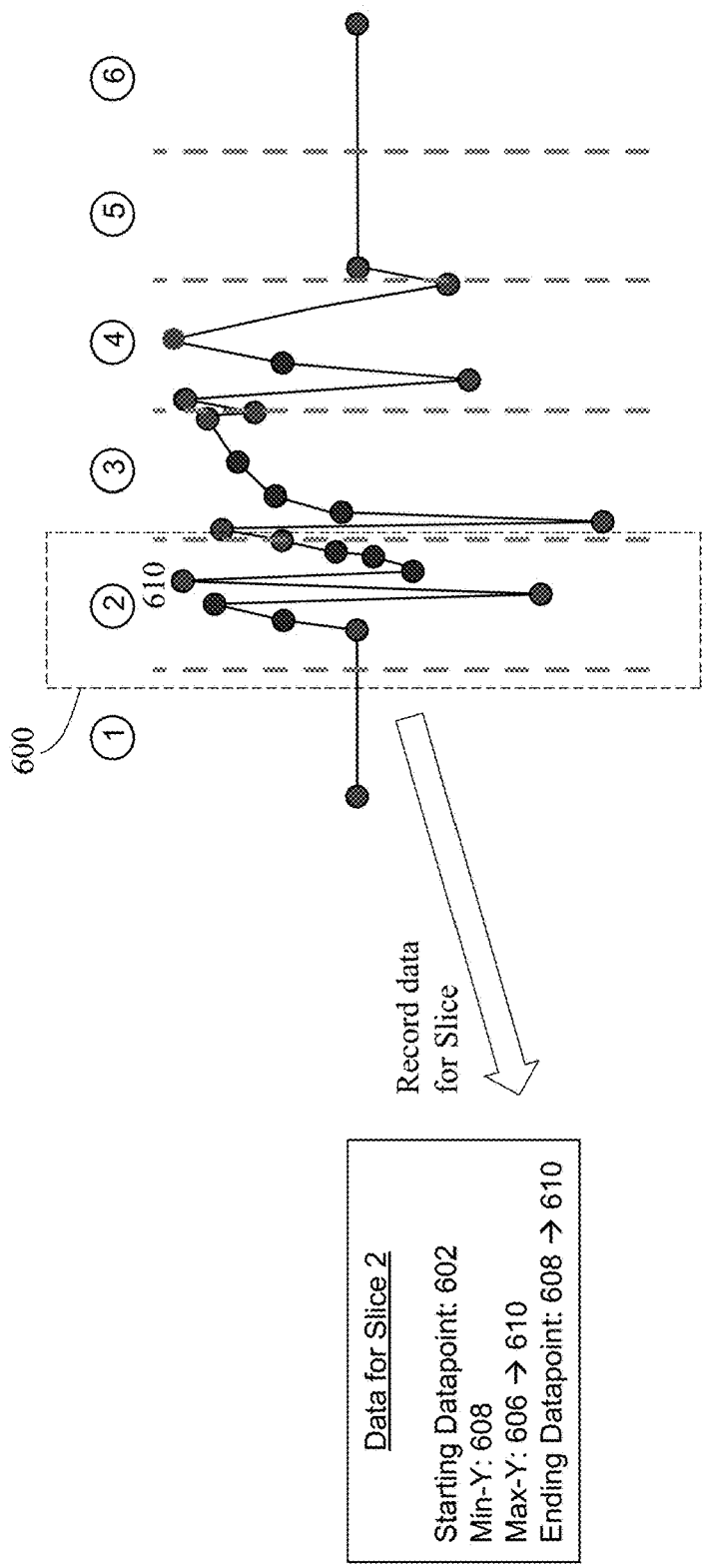
Figure 6L:
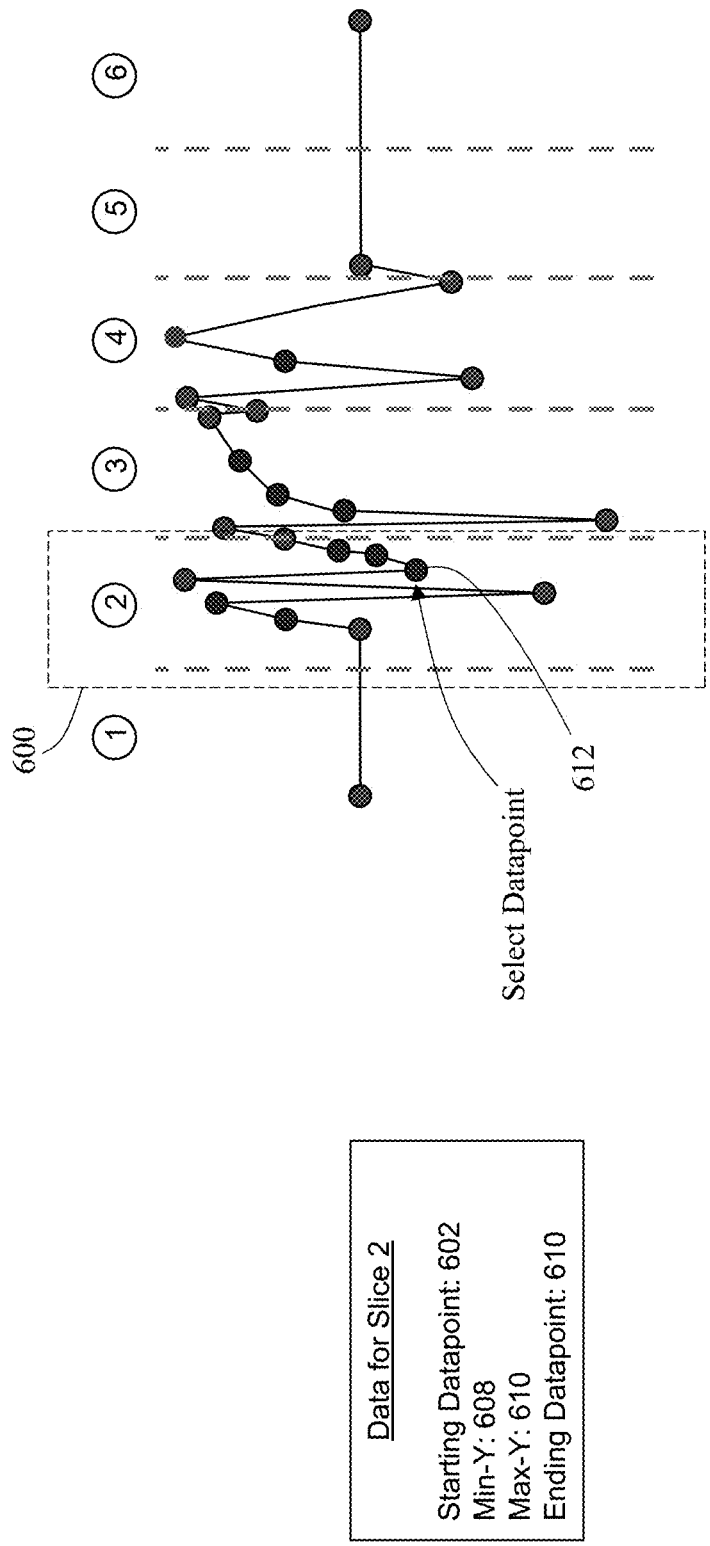
Figure 6M:
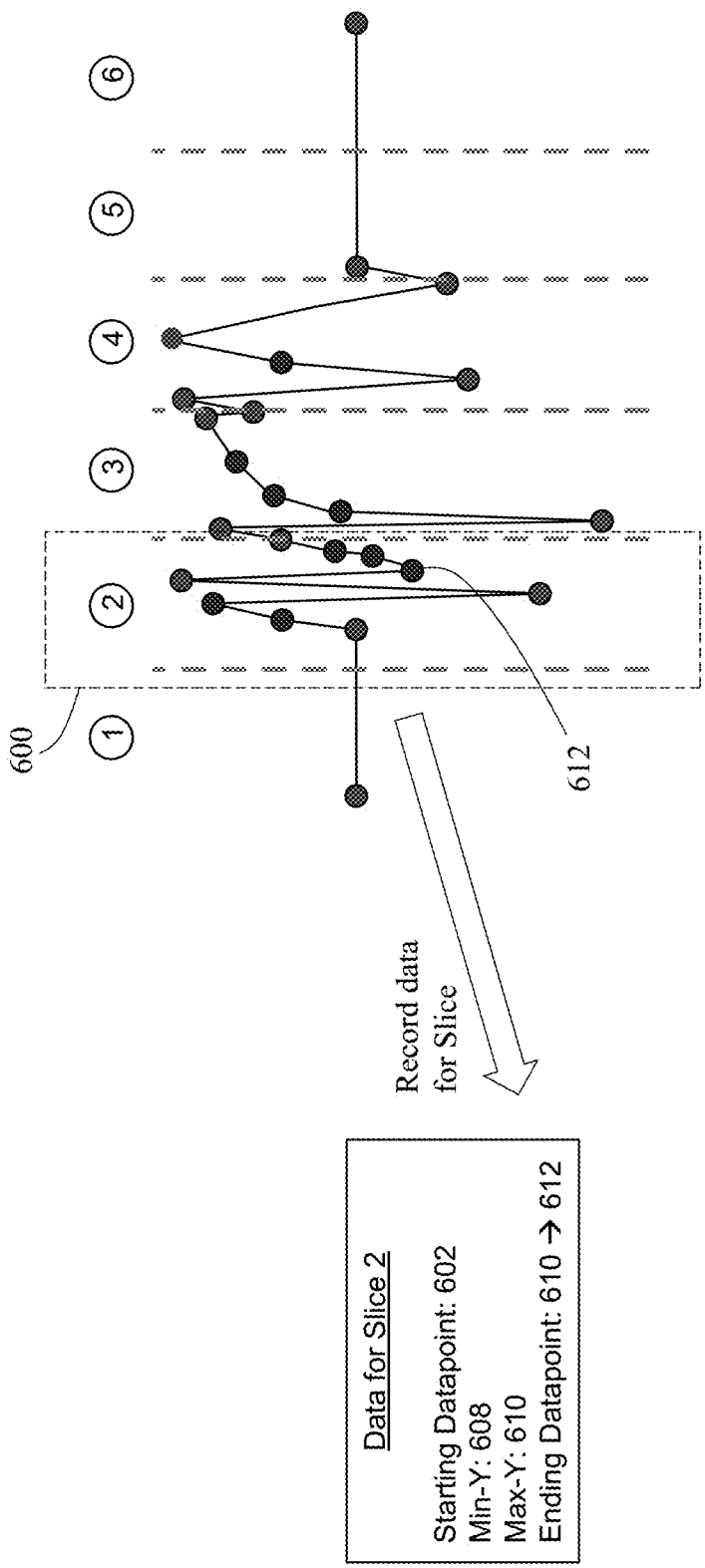
Figure 6N:
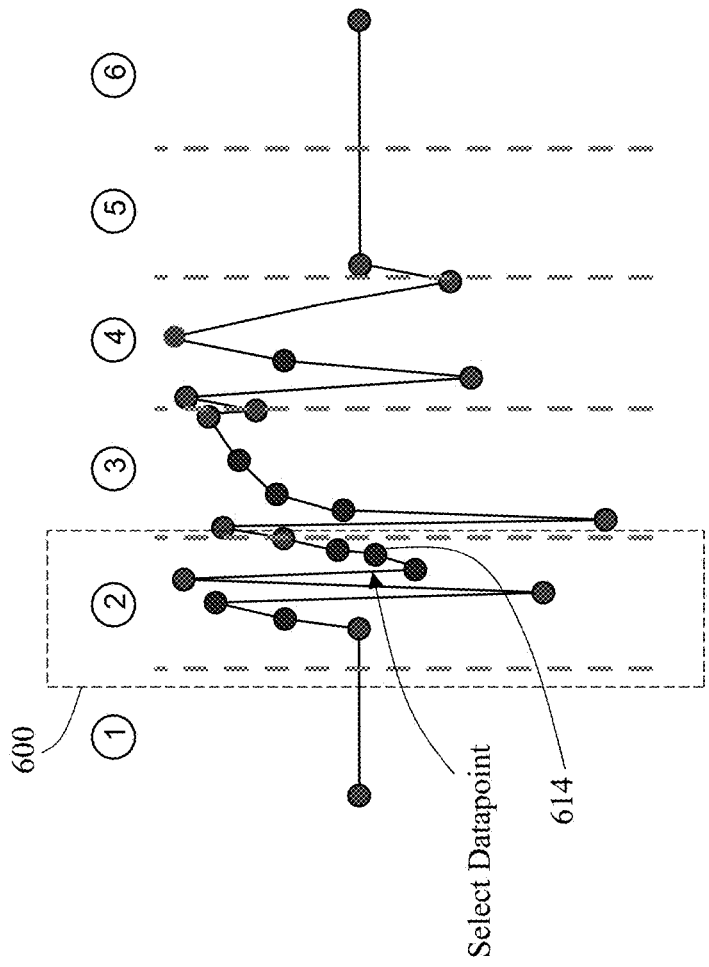
Figure 6O:
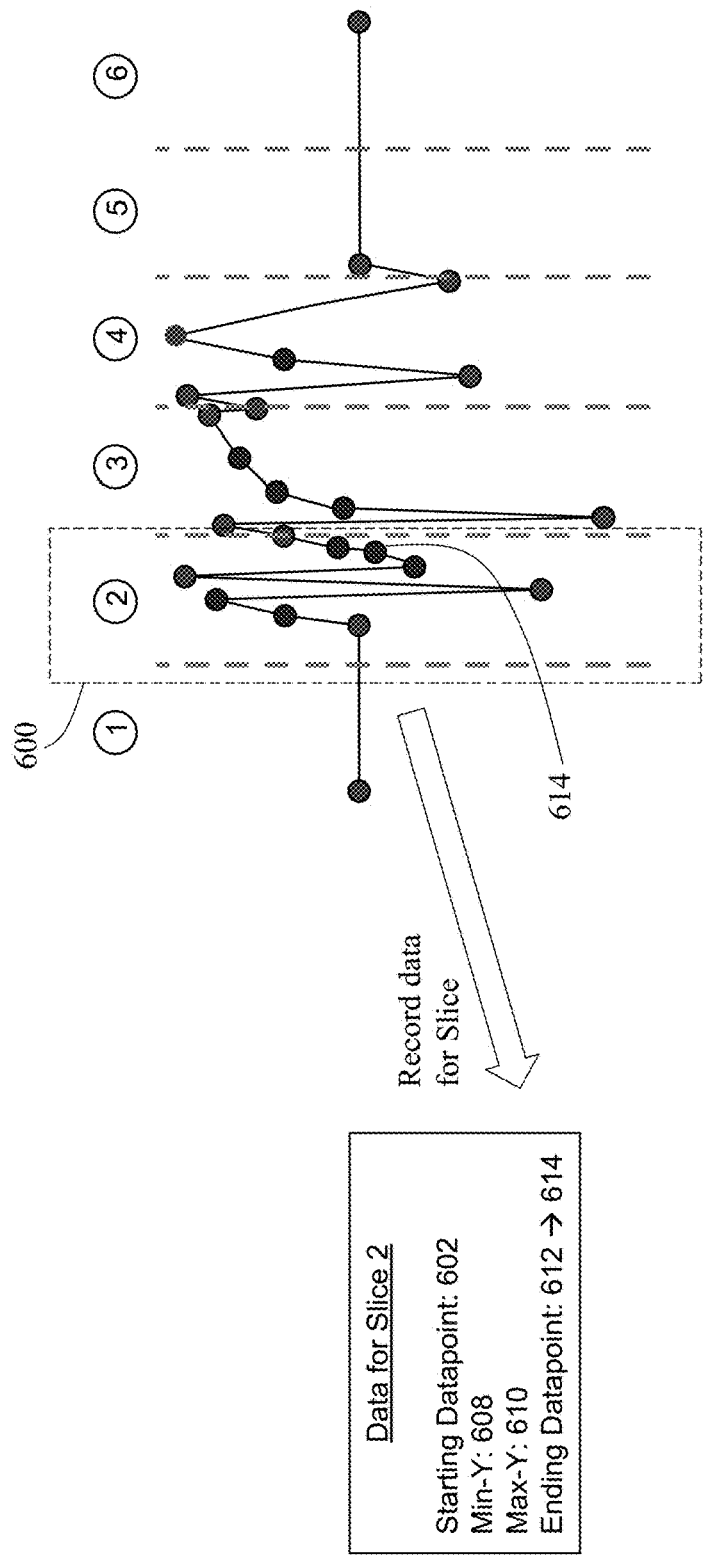
Figure 6P:
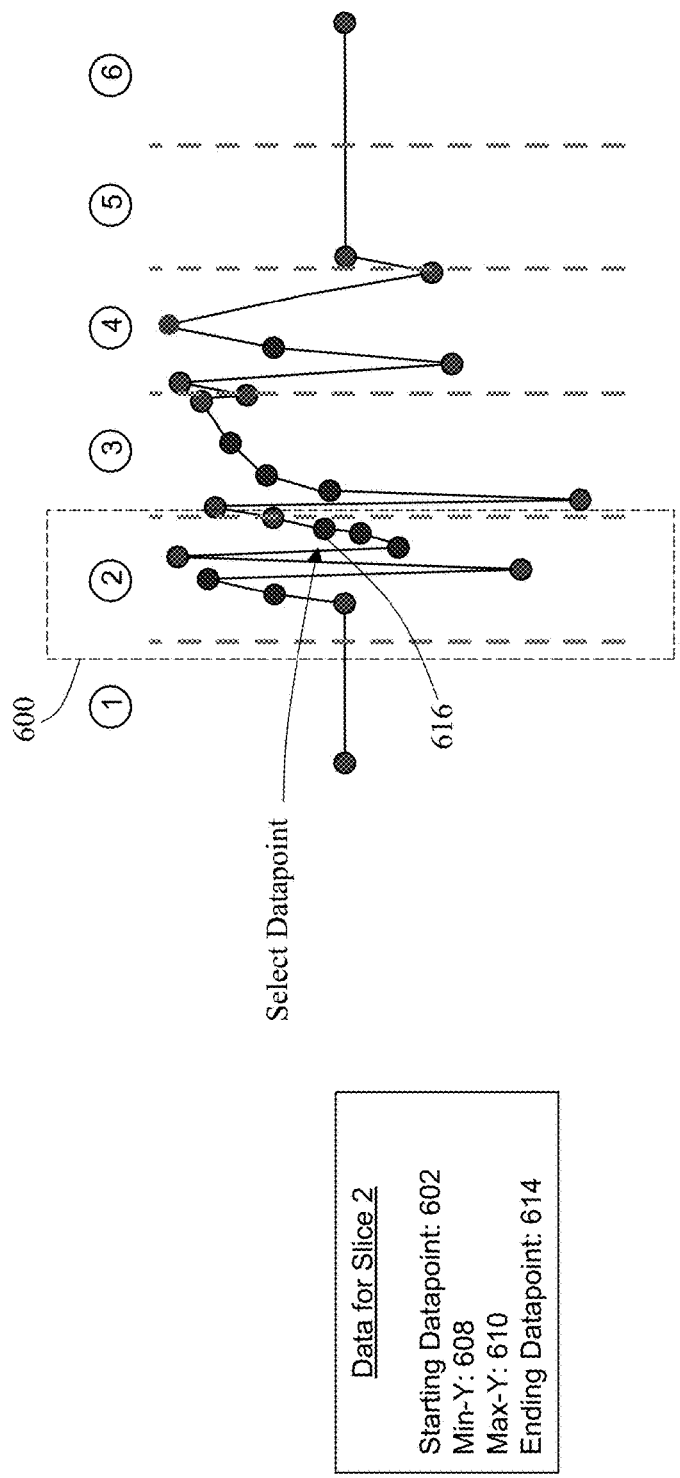
Figure 6Q:
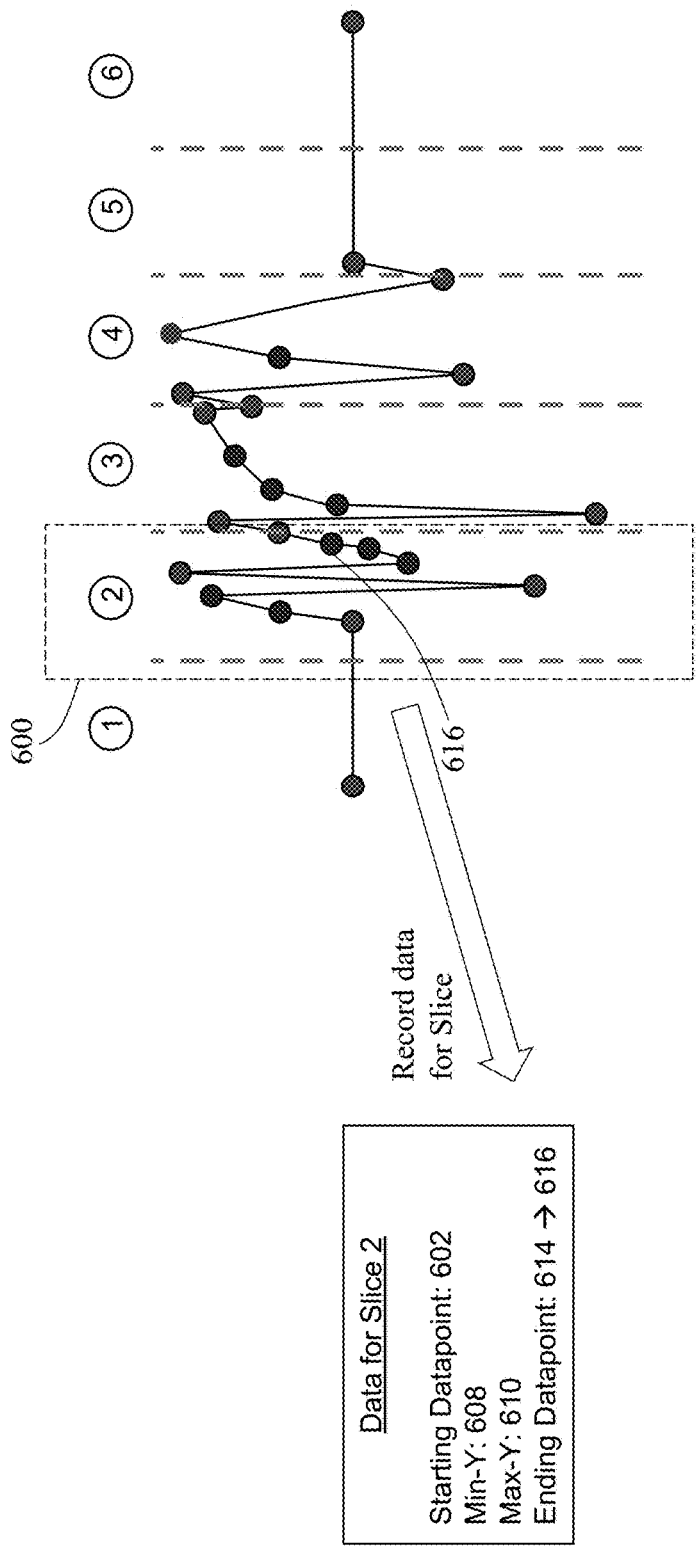
Figure 6R:
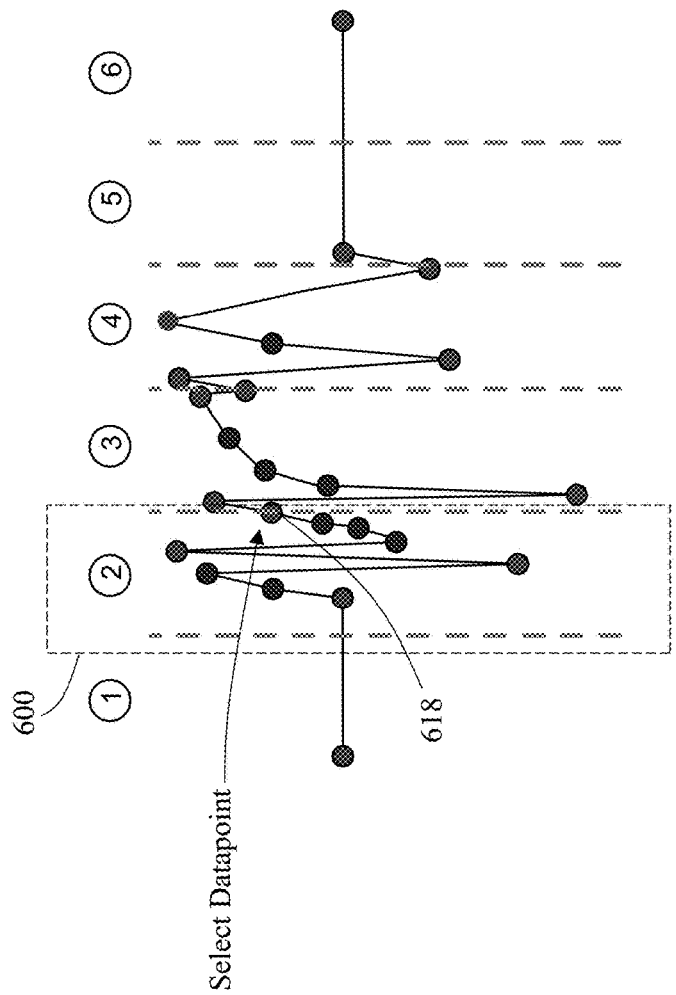
Figure 6S:
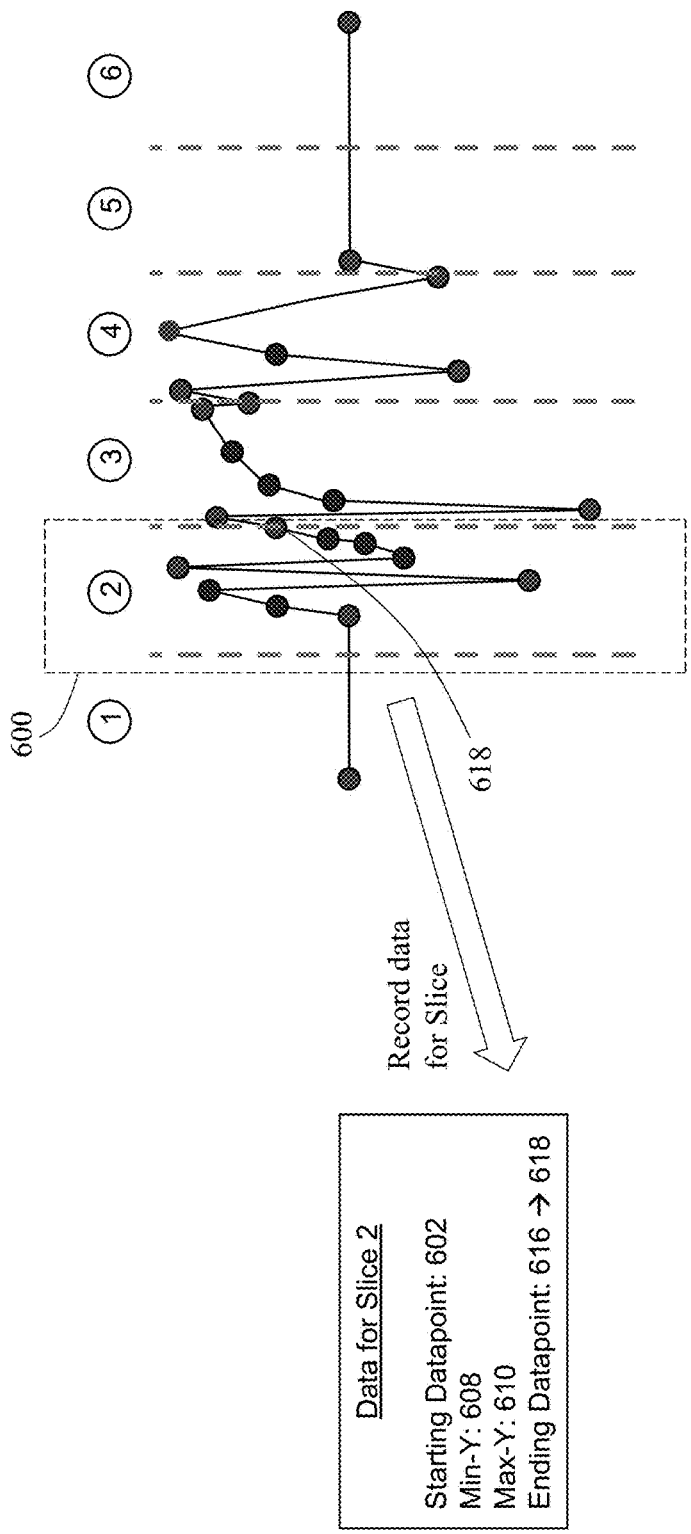
Figure 6T:
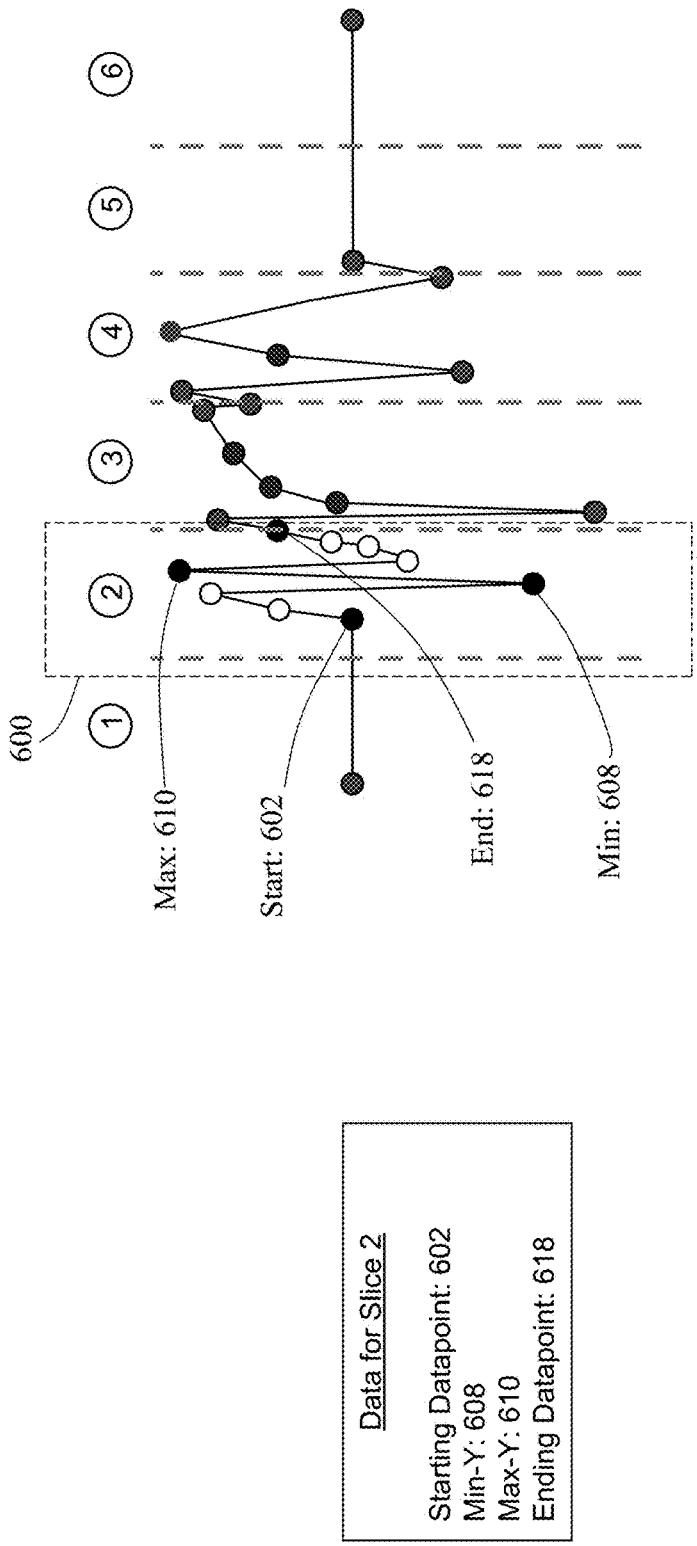

FIGS. 6A-6T illustrate the processing that will occur for slice number 2. In FIG. 6A, box 600 is drawn to represent the span of any datapoints having an X value which translates to the second slice.

As shown in FIG. 6B, datapoint 602 is selected for processing. In this situation, the X value of datapoint 602 translates to slice number 2. Therefore, as shown in FIG. 6C, this datapoint is recorded for each of the four categories for slice number 2 for (a) starting datapoint, (b) minimum Y datapoint, (c) maximum Y datapoint, and (d) ending datapoint.

As shown in FIG. 6D, the next datapoint 604 is selected for processing. In this situation, the X value of datapoint 602 translates to slice number 2. Therefore, a determination is now made whether this datapoint 604 has an X or Y value that would require an update to any of the categories which have already been recorded for slice number 2.

It can be seen that datapoint 604 has a higher Y value as compared to the datapoint 602 that was previously recorded for the maximum Y value. Therefore, as shown in FIG. 6E, datapoint 604 replaces datapoint 602 in the recorded category of the maximum Y datapoint.

In addition, since datapoint 604 is further along the X-axis as compared to datapoint 602 that was previously recorded as the last datapoint for the slice, then datapoint 604 also replaces datapoint 602 for this category as well.

As shown in FIG. 6F, the next datapoint 606 is selected for processing. In this situation, the X value of datapoint 604 translates to slice number 2. Therefore, a determination is now made whether this datapoint 606 has an X or Y value that would require an update to any of the categories which have already been recorded for slice number 2. Here, the datapoint establishes a new maximum Y value as compared to any of the previous datapoints for slice number 2. Therefore, as shown in FIG. 6G, datapoint 606 will be recorded as the new maximum Y datapoint. In addition, since datapoint 606 is further along the X-axis as compared to any previous datapoint for slice number 2, this means that datapoint 606 also replaces the previously recorded datapoint for this category as well.

As shown in FIG. 6H, the next datapoint 608 is selected for processing. In this situation, the X value of datapoint 608 also translates to slice number 2. Therefore, a determination is made whether this datapoint 608 has an X or Y value that would require an update to any of the categories which have already been recorded for slice number 2. Here, the datapoint establishes a new minimum Y value as compared to any of the previous datapoints for slice number 2. Therefore, as shown in FIG. 6I, datapoint 608 will be recorded as the new minimum Y datapoint. In addition, since datapoint 608 is further along the X-axis as compared to any previous datapoint for slice number 2, this means that datapoint 609 also replaces the previously recorded datapoint for this category as well.

As shown in FIG. 6J, the next datapoint 610 is selected for processing. In this situation, the X value of datapoint 610 also translates to slice number 2. A determination is made whether this datapoint has an X or Y value that would require an update to any of the categories which have already been recorded for slice number 2. Here, the datapoint establishes a new maximum Y value as compared to any of the previous datapoints for slice number 2. Therefore, as shown in FIG. 6K, datapoint 610 will be recorded as the new maximum Y datapoint. In addition, since datapoint 610 is further along the X-axis as compared to any previous datapoint for slice number 2, this means that datapoint 610 also replaces the previously recorded datapoint for this category as well.

As shown in FIG. 6L, the next datapoint 612 is selected for processing, where the X value of datapoint 612 translates to slice number 2. A determination is made whether this datapoint has an X or Y value that would require an update to any of the categories which have already been recorded for slice number 2.

In this situation, the datapoint 612 does not have a Y value that is greater than the previous maximum Y datapoint, nor does it have a Y value that is less than the minimum Y datapoint. Therefore, this datapoint will not displace either the maximum Y datapoint or the minimum Y datapoint. However, as shown in FIG. 6M, since datapoint 612 is further along the X-axis as compared to any previous datapoint for slice number 2, this means that datapoint 612 will replace the previously recorded datapoint for this category.

In a similar manner, as shown in FIG. 6N, the next datapoint 614 is selected for processing in slice number 2, where this datapoint does not have a Y value that is greater than the previous maximum Y datapoint, nor does it have a Y value that is less than the minimum Y datapoint. Therefore, this datapoint will not displace either the maximum Y datapoint or the minimum Y datapoint for slice number 2. However, as shown in FIG. 6O, since datapoint 614 is further along the X-axis as compared to any previous datapoint for slice number 2, this means that datapoint 614 will replace the previously recorded datapoint for this category.

As shown in FIG. 6P, the next datapoint 616 is selected for processing. As before, this datapoint in slice number 2, and this datapoint does not have a Y value that is greater than the previous maximum Y datapoint, nor does it have a Y value that is less than the minimum Y datapoint. Therefore, this datapoint will not displace either the maximum Y datapoint or the minimum Y datapoint for slice number 2. However, as shown in FIG. 6Q, since datapoint 616 is further along the X-axis as compared to any previous datapoint for slice number 2, this means that datapoint 616 will replace the previously recorded datapoint for this category.

As shown in FIG. 6R, the next datapoint 618 is selected for processing. One again, this datapoint in slice number 2, where the datapoint does not have a Y value that is greater than the previous maximum Y datapoint, nor does it have a Y value that is less than the minimum Y datapoint. Therefore, this datapoint will not displace either the maximum Y datapoint or the minimum Y datapoint for slice number 2. However, as shown in FIG. 6S, since datapoint 616 is further along the X-axis as compared to any previous datapoint for slice number 2, this means that datapoint 616 will replace the previously recorded datapoint for this category.

At this point, the last datapoint in slice number 2 has now been reached. Therefore, as shown in FIG. 6T, the datapoints for each of the four categories have now been recorded for slice number 2. For this slice, the starting datapoint is recorded as datapoint 602, the minimum Y datapoint is recorded as datapoint 608, the maximum Y datapoint is recorded as datapoint 610, and the ending datapoint is recorded as datapoint 618. The filtered dataset now only needs to include these four datapoints 602, 608, 610, and 618. All other datapoints within this slice can now be removed from the filtered dataset. In this case, datapoints 604, 606, 612, 614, and 616 can be removed from the filtered dataset. This means that a reduction of 55% has been achieved from data slice number 2 (5 removed datapoints/9 original datapoints in slice).

Figure 7:
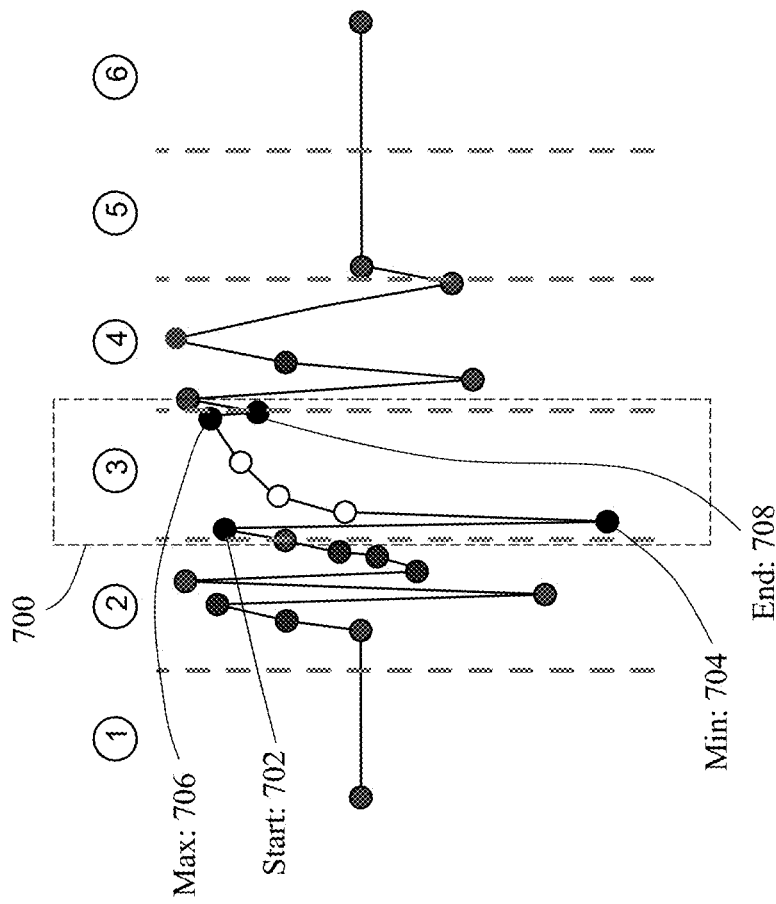

FIG. 7 illustrates this process performed against the datapoints in slice number 3. Here, the starting datapoint is recorded as datapoint 702, the minimum Y datapoint is recorded as datapoint 704, the maximum Y datapoint is recorded as datapoint 706, and the ending datapoint is recorded as datapoint 708. The filtered dataset now only needs to include these four datapoints, where all other datapoints within this slice can now be removed from the filtered dataset.

Figure 8:
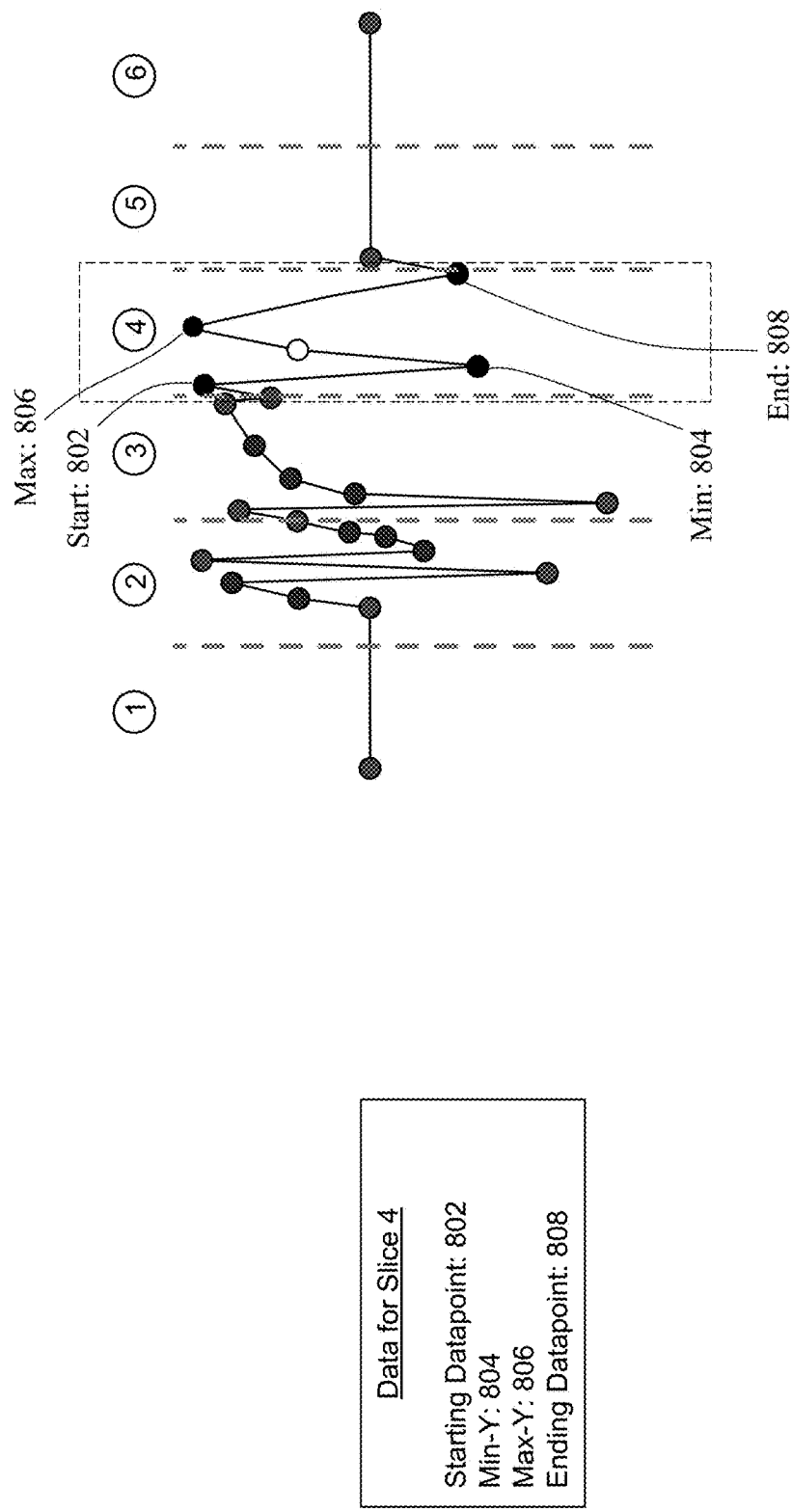

FIG. 8 illustrates this process performed against the datapoints in slice number 4. Here, the starting datapoint is recorded as datapoint 802, the minimum Y datapoint is recorded as datapoint 804, the maximum Y datapoint is recorded as datapoint 806, and the ending datapoint is recorded as datapoint 808. The filtered dataset now only needs to include these four datapoints, where all other datapoints within this slice can now be removed from the filtered dataset.

Figure 9:
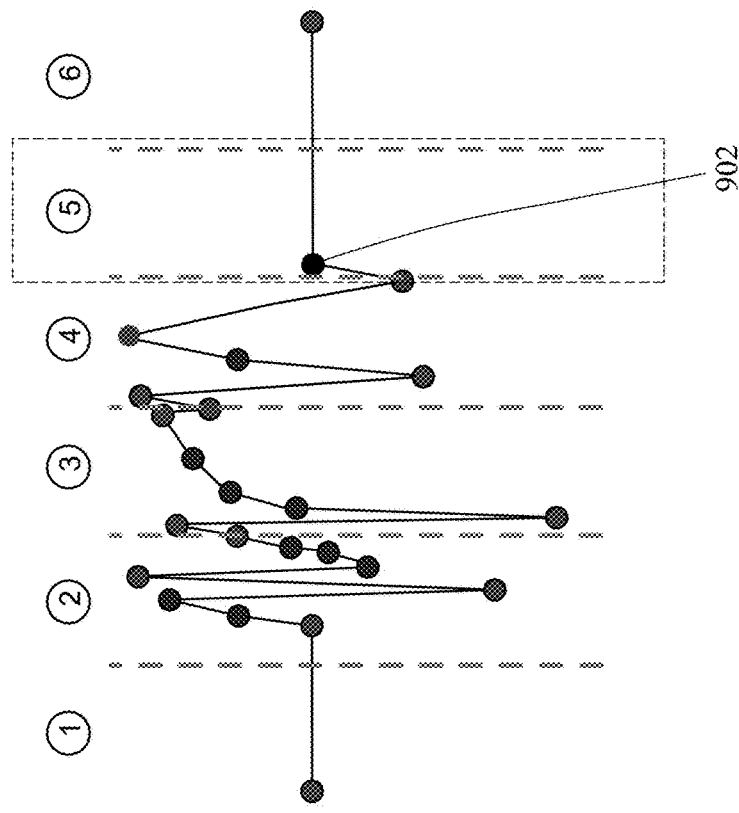

FIG. 9 illustrates this process performed against the datapoints in slice number 5. This slice only includes a single datapoint 902. Therefore, datapoint 902 is recorded for each of the four categories.

Figure 10:
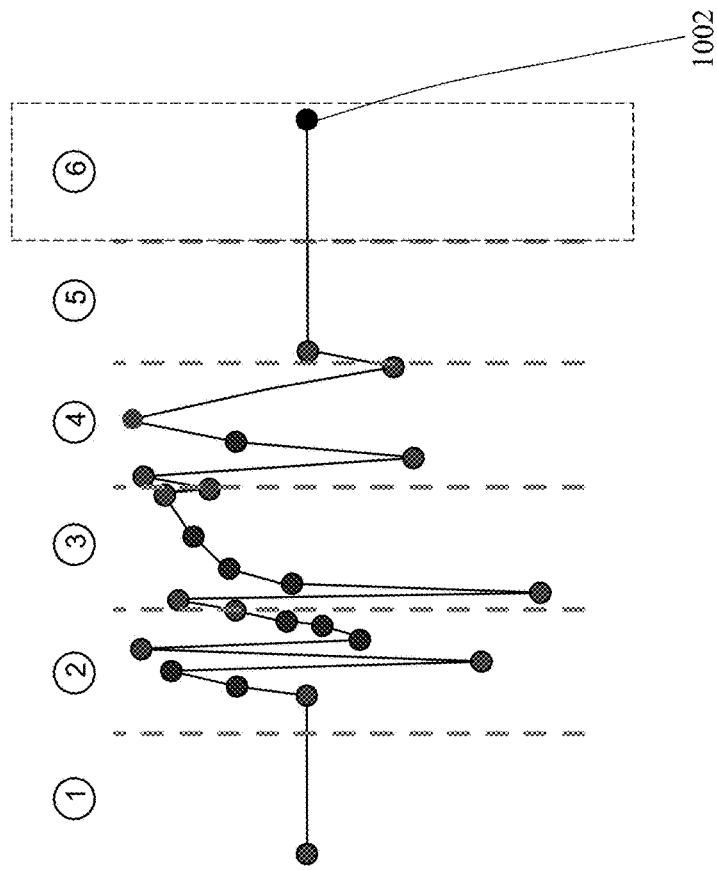

FIG. 10 illustrates this process performed against the datapoints in slice number 6. As before, this slice only includes a single datapoint 1002. Therefore, datapoint 1002 is recorded for each of the four categories.

Figure 11:
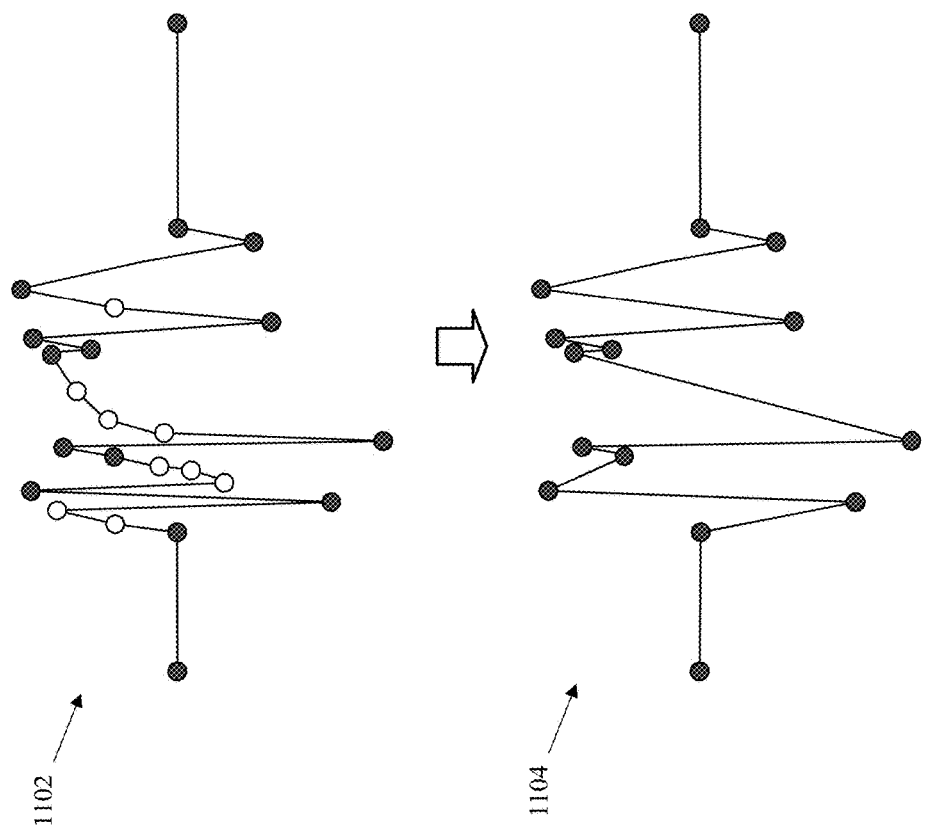

FIG. 11 illustrates the overall effects of the filtering for the entire waveform. Waveform 1102 represents the raw dataset having all of the original datapoints. The datapoints to be retained as shown as solid circles and the datapoints to be removed are shown as hollow circles. Waveform 1104 represents the filtered dataset with the filtered datapoints removed. As can be seen, this approach can significantly reduce the amount of data for waveforms, and hence reduce the amount of data that needs to be processed to render waveforms for display.

Figure 12:
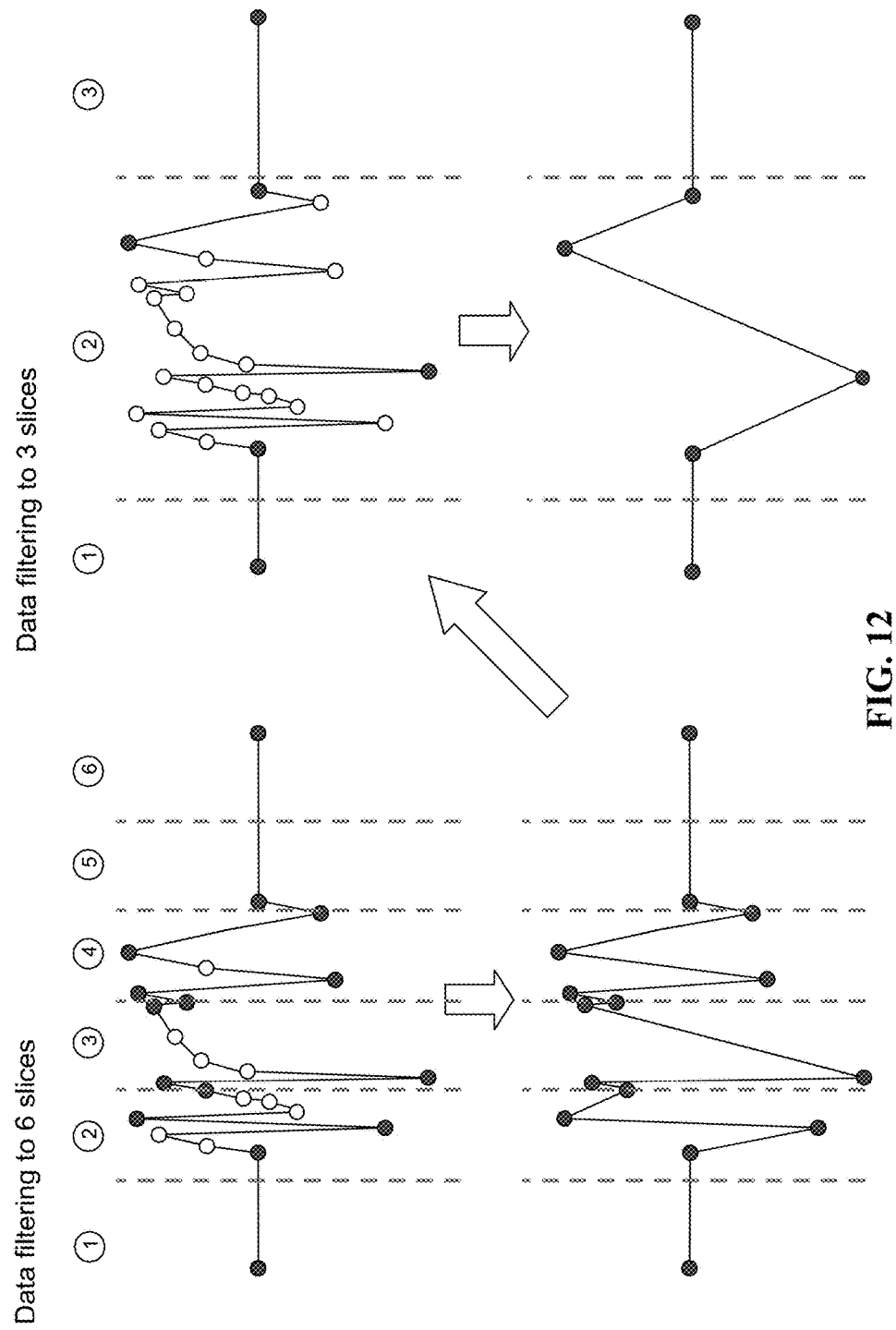
FIG. 12 illustrates multiple levels of filtering.

Multiple levels of filtering can be applied to the waveform data. FIG. 12 illustrates this type of processing. The left portion of this figure shows the results of the processing described above, where an original raw dataset has been reduced into six slices. That set of reduced data in the six slices can undergo further filtering. As shown on the right portion of the figure, data filtering may be applied again for three slices, where the reduced dataset undergoes the same processing, with new slice boundaries drawn for the three slices.

Figure 13:
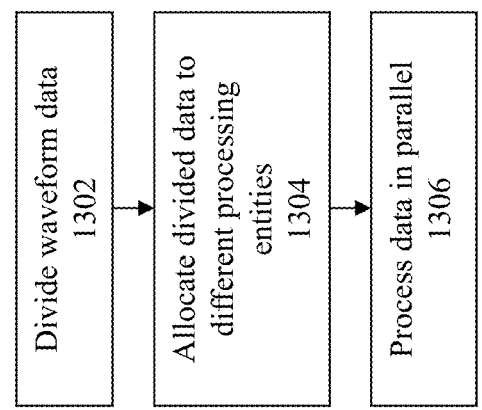
FIG. 13 shows a flowchart of an approach to implement data reduction in parallel according to some embodiments of the invention.

One advantage of the present approach is that it facilitates concurrent and/or parallel processing of the workload. FIG. 13 shows a flowchart of an approach to implement this type of processing. At 1302, the waveform data is divided into multiple portions. In one embodiment, the waveform data can be divided into multiple equal-sized blocks, in an order of monotonically increasing values for the X coordinate parameter of the datapoints.

At 1304, the divided portions of the waveform data can be allocated to different processing entities. A processing entity corresponds to any entity that is capable of performing work in the computing system. Examples of such processing entities include processes, threads, tasks, nodes, and individual computing systems. At 1306 the data within the slices are then processed in parallel.

By way of illustration, consider an example waveform having 1000 datapoints. The 1000-datapoint waveform can be divided into four equal-sized blocks having 250 datapoints in each block. The first 250 (X,Y) pairs in the waveform can be processed by a first process entity, the second 250 data points on a second processing entity, and so on. The final sets of filtered results can then be stitched together in order to complete the processing.

One approach to implement this type of parallel allocation and processing is by establishing a work queue, where each divided waveform portion is placed as a workload within the queue. A set of multiple processing entities is assigned handle work from the work queue. Each of the different processing entities will acquire workload from the work queue for processing. The processing entity will then walk through each of the datapoints for its assigned workload to identify the four categories, e.g., using the processing steps described above. Upon completion, the results for that waveform portion are recorded, and the processing entity then retrieves another workload from the work queue for processing. The processing ends when there are no further workload in the work queue for processing.

One optimization that can be performed for filtering in some embodiments is to filter the raw data to have the same size as the number of pixels in X direction on the display screen. In this optimization, the filtered data is sized and scaled for the number of pixels on the screen and is then displayed on the display device. If the number of datapoints in the original waveform data far exceeds the ability of the display device to visually reproduce those datapoints, then the raw waveform can be filtered to remove the extraneous datapoints.

Another optimization pertains to the drawing of thick lines on the display screen. If the user manipulates the UI of the waveform tool to use thicker lines to represent the displayed waveform, then less data resolution is necessary to generate the waveform display data—since excess resolution from the original data will not show up anyway in the final displayed waveform. This means that the excess resolution can be filtered out in the waveform data that needs to be processed by the GPU.

Figure 14:
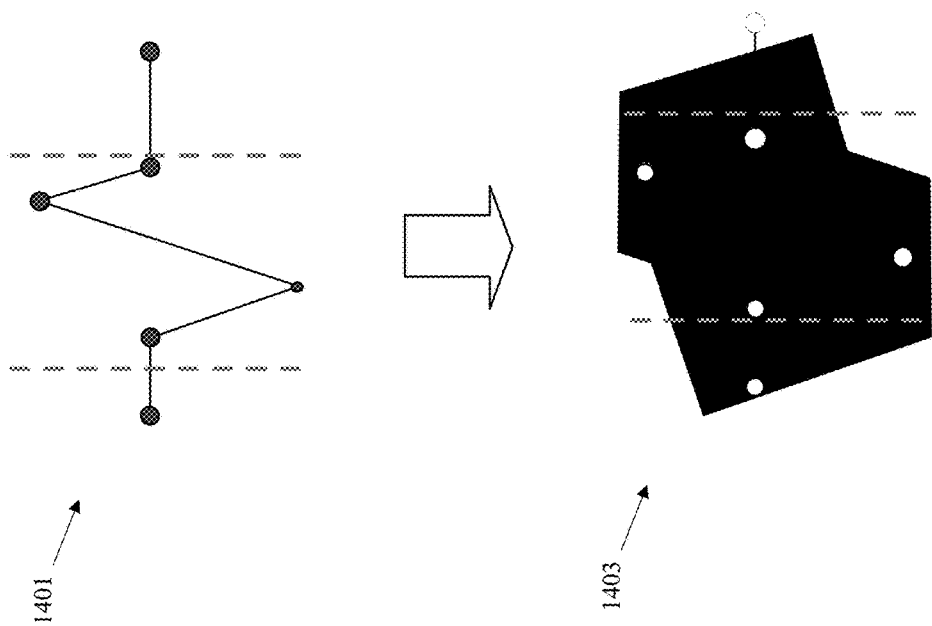
FIG. 14 illustrates processing relative to thick lines according to some embodiments of the invention.

To explain, consider the dataset 1401 shown in FIG. 14. Assume that this dataset is mapped to a one pixel column on a display screen, where the user desires magnification such that the line thickness of the waveform shape corresponding to 1403. In this situation, the magnified waveform is large enough such that the many of the original datapoints are indistinguishable in the final displayed waveform. This is shown in the 1403 by the locations of the datapoints (represented by the hollow circles) that are located within the volume of the line width. In this situation, the data can be filtered, e.g., where pixels in the X direction are divided by line thickness in the pixels.

Another embodiment can be used to facilitate intercept gathering. For example, a user may seek to examine details of data at a given X location in the waveform. Rather than requiring the entirety of the raw data to be scanned for this type of processing, some embodiments can instead filter the raw data into a reduced dataset, e.g., by generating data filtered for screen X pixel size. From this filtered dataset, two datapoints bounding an intercept (X=n=>Y=?) are identified in the filtered data. Those datapoints are used to define a range to search the original data for the exact intercept.

Figure 15:
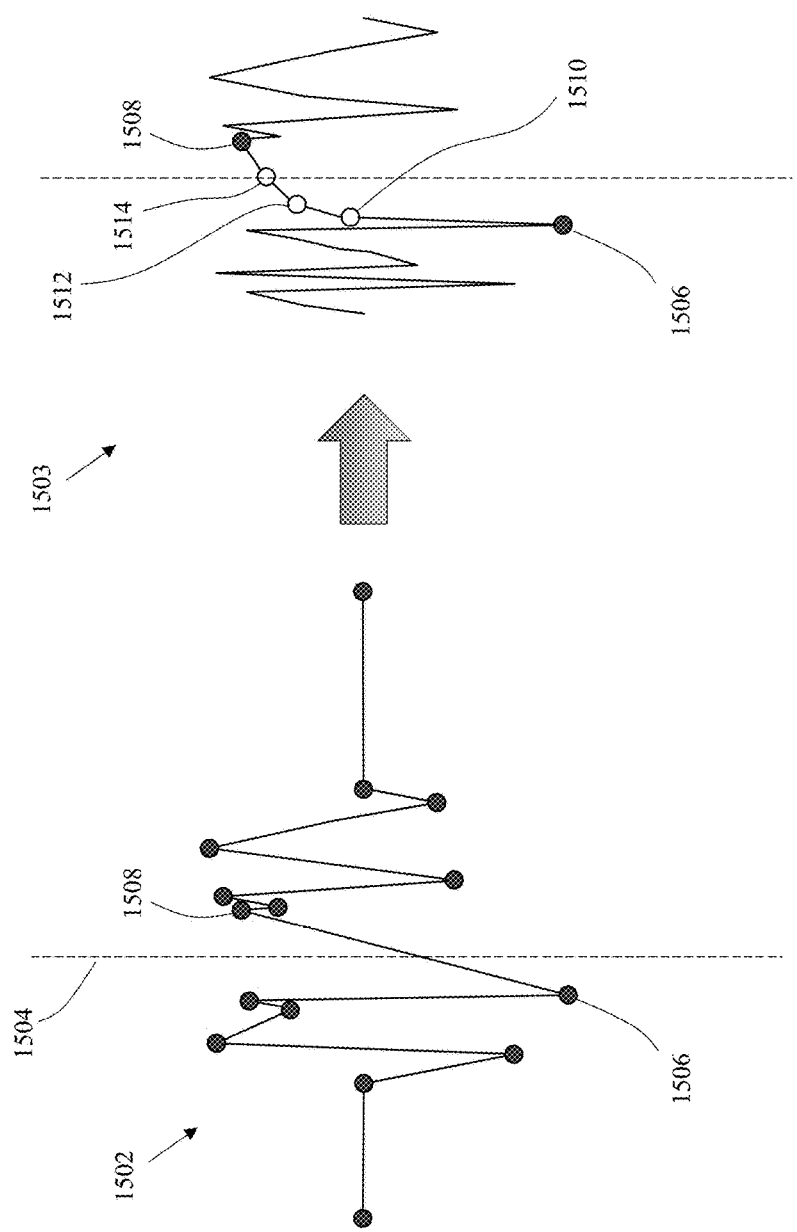
FIG. 15 illustrates processing for intercept gathering according to some embodiments of the invention.

To illustrate, consider the filtered waveform 1502 shown in FIG. 15. An intercept line 1504 may be placed at any arbitrary location. In this case, the intercept line is drawn between datapoints 1506 and 1508 in the filtered dataset 1502.

To perform intercept gathering, the entirety of the raw data does not need to be accessed. Instead, only the raw data from between datapoints 1506 and 1508 need to be accessed, as shown in waveform 1503. In this case, the datapoints 1510, 1512, and 1514 that exist between datapoints 1506 and 1508 had previously been filtered from the raw dataset to create the filtered dataset 1502. These datapoints are among a large number of other datapoints that may have been removed from the raw data to create the filtered dataset 1502. However, because datapoints 1506 and 1508 were identified from the intercept line 1504, only the portion of the raw datapoints between these two points (encompassing datapoints 1510, 1512, and 1514) needs to be accessed to perform the intercept gathering.

Another optimization according to some embodiments is to perform min/max value gathering. This pertains to a degenerate situation where data may be filtered to just a single slice. In this case, the slice includes only the first point, last point, and min and max values. From this, the embodiment extracts the min/max value from the four points.

Yet another embodiment can be implemented to perform smoothing upon the filtered waveform data. At higher levels of data reduction, it is possible that the displayed waveform may include visible "jaggedness" in the waveform lines. Smoothing may be performed to reduce this type of artifact from the displayed image. Any suitable approach may be taken to smooth the waveform data. For example, linear smoothing or moving average smoothing may be applied to smooth the waveform data.

Caching may also be performed in some embodiments. With caching, previously filtered data may be stored and re-used, rather than requiring filtered data to be re-generated each time the user encounters a given portion of the waveform.

Pre-caching may be performed in some embodiments to provide a first level of waveform display at pre-set resolution levels, with background processing to achieve specific resolution levels appropriate for the specific situation at hand. With this approach, the pre-set resolution level of the cached data can be immediately provided to the user without any processing delay to perform any filtering. As the filtered data for the specific desired resolution level is provided, the initial set of display data is replaced with the newly generated filtered data.

Therefore, what has been described is an improved approach to generate and display waveform data, where data reduction is intelligently applied to create filtered waveform data. By reducing the quantity of the waveform data in an intelligent manner, this permits the waveform display tool to process the waveforms quickly enough for interactive usage, while still retaining sufficient data fidelity for accurate data analysis and waveform visualization.

System Architecture Overview

Figure 16:
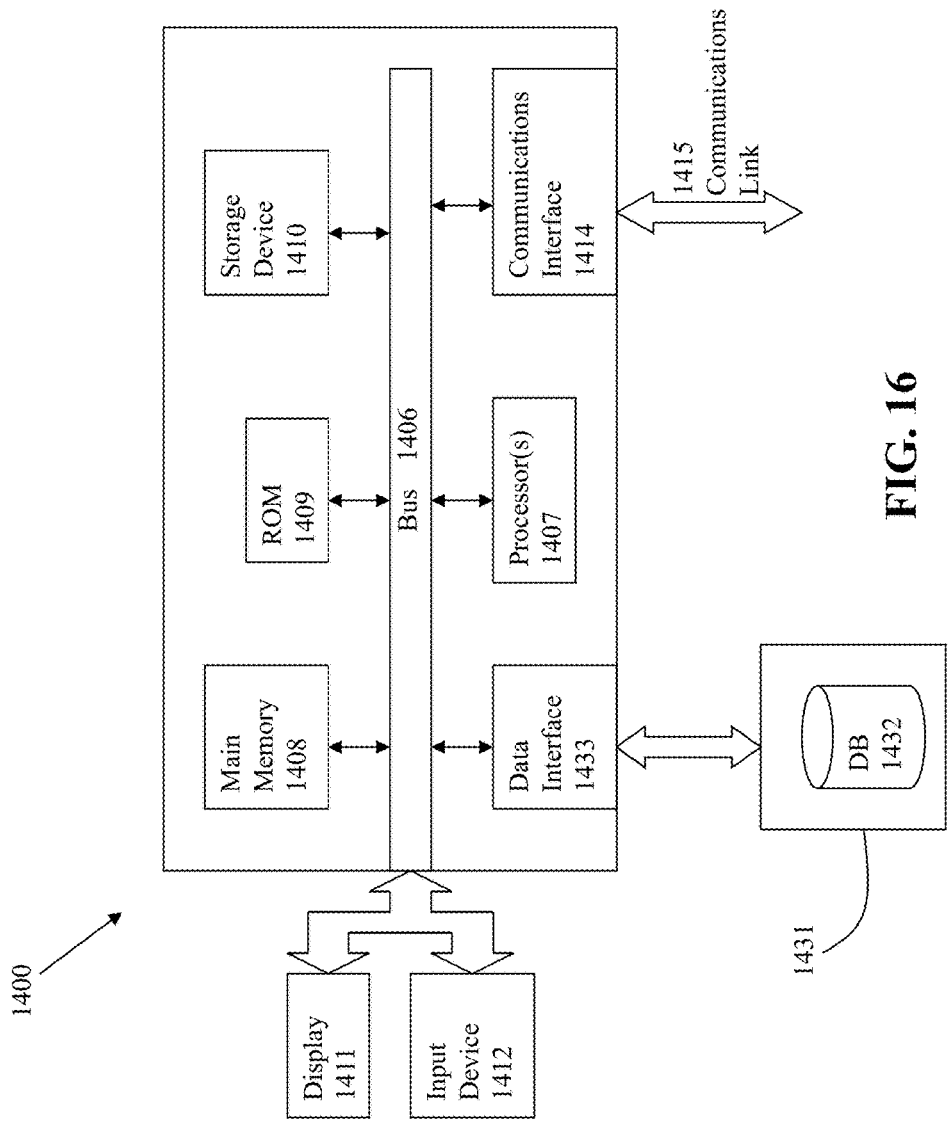
FIG. 16 depicts a computerized system on which some embodiments of the invention can be implemented.

FIG. 16 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, e.g., application code, through communication link 1415 and communication interface 1414. Received program code may be executed by processor 1407 as it is received, and/or stored in disk drive 1410, or other non-volatile storage for later execution. Computer system 1400 may communicate through a data interface 1433 to a database 1432 on an external storage device 1431.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A method implemented with a processor of a computing system, comprising:
   receiving waveform data corresponding to an electronic circuit design;
   receiving a user instruction from a graphical user interface, the user instruction pertaining to changing a resolution of a graphical representation of at least some of the waveform data to a different resolution in the graphical user interface;
   dividing, at a data reduction module coupled to at least one microprocessor of and stored at least partially in memory of a computing system, the waveform data into a plurality of slices based in part or in whole upon one or more display characteristics of the display device or one or more graphical characteristics of the graphical representation for the at least some of the waveform data;
   identifying one or more datapoints that respectively correspond to a predetermined number of datapoint categories for at least one slice of the plurality of slices;
   for the at least one slice, generating a filtered dataset at least by filtering out, at the data reduction module and based at least in part upon the user instruction, datapoints that do not correspond to the number of datapoint categories from the waveform data; and
   processing, at a processing infrastructure comprising a graphics processing unit of a computing system, the filtered dataset to render the filtered data set into the graphical representation having the one or more graphical characteristics at the different resolution for display in the graphical user interface based in part or in whole upon the user instruction and the one or more display characteristics that comprises a total number or size of pixels in at least a display area in the graphical user interface of a display device of the computing system or of a different computing system.

2. The method of claim 1, in which the number of datapoint categories includes a first category corresponding to starting datapoints, a second category corresponding to ending datapoints, a third category corresponding to maximum datapoints, and a fourth category corresponding to minimum datapoints.

3. The method of claim 1, in which multiple levels of filtering are applied to the waveform data and the waveform data corresponds to simulation data for the electronic circuit design.

4. The method of claim 1, wherein a number of slices is established based at least in part on consideration of at least one of thickness of displayed lines, magnification level for display, a number of waveforms to simultaneously display, tuning for displayable resolution of a screen display, or user preference for data reduction.

5. The method of claim 1, wherein the one or more display characteristics of the display device comprises a size or a resolution of the display device, and the one or more graphical characteristics of the graphical representation comprise a geometric characteristic of a graphical or textual element rendered in the graphical user interface.

6. The method of claim 1, wherein data associated with different slices are processed in parallel by different processing entities, and intercept processing is performed by identifying bounding datapoints from the filtered dataset and accessing unfiltered data from between the bounding datapoints.

7. The method of claim 1, wherein data caching is performed to cache the filtered dataset, where the filtered dataset provides an initial set of displayable data that is immediately provided in response to a user request while another filtered dataset is generated for later display in response to the user request.

8. A computer program product embodied on a computer readable medium, the computer readable medium having stored thereon a sequence of instructions which, when executed by a processor causes the processor to execute a method comprising:
   receiving waveform data corresponding to an electronic circuit design;
   receiving a user instruction from a graphical user interface, the user instruction pertaining to changing a resolution of a graphical representation of at least some of the waveform data to a different resolution in the graphical user interface;
   dividing the waveform data into a plurality of slices based in part or in whole upon one or more display characteristics of the display device or one or more graphical characteristics of the graphical representation of the at least some of the waveform data;
   identifying one or more datapoints that respectively correspond to a predetermined number of datapoint categories for at least one slice of the plurality of slices;
   for the at least one slice, generating a filtered dataset at least by filtering out, at the data reduction module and based at least in part upon the user instruction, datapoints that do not correspond to the number of datapoint categories from the waveform data; and processing, at a processing infrastructure comprising a graphics processing unit of a computing system, the filtered dataset to render the filtered data set into a graphical representation having the one or more graphical characteristics at the different resolution for display in the graphical user interface based in part or in whole upon the user instruction and the one or more display characteristics that comprises a total number or size of pixels in at least a display area in the graphical user interface of a display device of the computing system or of a different computing system.

9. The computer program product of claim 8, in which the waveform data corresponds to simulation data for the electronic circuit design.

10. The computer program product of claim 8, in which multiple levels of filtering are applied to the waveform data.

11. The computer program product of claim 8, wherein a number of slices is established based at least in part on consideration of at least one of thickness of displayed lines, magnification level for display, a number of waveforms to simultaneously display, tuning for displayable resolution of a screen display, or user preference for data reduction.

12. The computer program product of claim 8, wherein data associated with different slices are processed in parallel by different processing entities.

13. The computer program product of claim 8, wherein intercept processing is performed by identifying bounding datapoints from the filtered dataset and accessing unfiltered data from between the bounding datapoints.

14. The computer program product of claim 8, wherein data caching is performed to cache the filtered dataset, where the filtered dataset provides an initial set of displayable data that is immediately provided in response to a user request while another filtered dataset is generated for later display in response to the user request.

15. A system for analyzing a circuit design, comprising:
a processor;
a memory for holding programmable code, wherein
the programmable code includes instructions which, when executed by the processor, cause the processor to receive waveform data corresponding to an electronic circuit design,
a graphical user interface configured to receive a user instruction pertaining to changing a resolution of a graphical representation of at least some of the waveform data to a different resolution in the graphical user interface;
a data reduction module coupled to the processor and configured to divide the waveform data into a plurality of slices based in part or in whole upon one or more display characteristics of the display device or one or more graphical characteristics of the graphical representation of the at least some of the waveform data,
the data reduction module further configured to identify one or more datapoints that respectively correspond to a predetermined number of datapoint categories for at least one slice of the plurality of slices,
the data reduction module further configured to generate a filtered dataset at least by filtering out, at the data reduction module and based at least in part upon the user instruction for the at least one slice, datapoints that do not correspond to the number of datapoint categories from the waveform data, and
the processor and the data reduction module further configured to cause a processing infrastructure comprising a graphics processing unit of a computing system to process the filtered dataset to render the filtered data set into the graphical representation having the one or more graphical characteristics at the different resolution for display in the graphical user interface based in part or in whole upon the user instruction and the one or more display characteristics that comprises a total number or size of pixels in at least a display area in the graphical user interface of a display device of the computing system or of a different computing system.

16. The system of claim 15, in which the waveform data corresponds to simulation data for the electronic circuit design.

17. The system of claim 15, in which multiple levels of filtering are applied to the waveform data.

18. The system of claim 15, wherein a number of slices is established based at least in part on consideration of at least one of thickness of displayed lines, magnification level for display, a number of waveforms to simultaneously display, tuning for displayable resolution of a screen display, or user preference for data reduction.

19. The system of claim 15, wherein data associated with different slices are processed in parallel by different processing entities.

20. The system of claim 15, wherein intercept processing is performed by identifying bounding datapoints from the filtered dataset and accessing unfiltered data from between the bounding datapoints.

\* \* \* \* \*